US012501787B2

(12) United States Patent
Hsieh

(10) Patent No.: US 12,501,787 B2
(45) Date of Patent: Dec. 16, 2025

(54) DISPLAY PANEL AND DISPLAY DEVICE WITH CURVED LIGHT-SHIELDING PORTIONS

(71) Applicant: BOE TECHNOLOGY GROUP CO., LTD., Beijing (CN)

(72) Inventor: Mingche Hsieh, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 758 days.

(21) Appl. No.: 17/731,624

(22) Filed: Apr. 28, 2022

(65) Prior Publication Data

US 2022/0255048 A1    Aug. 11, 2022

Related U.S. Application Data

(63) Continuation-in-part of application No. 16/652,576, filed as application No. PCT/CN2019/081196 on Apr. 3, 2019, now Pat. No. 11,489,032.

(51) Int. Cl.

| H10K 59/126 | (2023.01) |
| H10K 59/121 | (2023.01) |
| H10K 59/80 | (2023.01) |
| H10K 59/131 | (2023.01) |

(52) U.S. Cl.
CPC ....... H10K 59/126 (2023.02); H10K 59/1213 (2023.02); H10K 59/8792 (2023.02); *H10K 59/131* (2023.02)

(58) Field of Classification Search
CPC . H10K 50/865; H10K 59/131; H10K 59/1213
See application file for complete search history.

(56) References Cited

U.S. PATENT DOCUMENTS

| 6,937,312 B2 | 8/2005 | Kadotani et al. |
| 10,831,069 B2 | 11/2020 | Okita |
| 11,489,032 B2 * | 11/2022 | Hsieh ............. H10K 59/65 |

(Continued)

FOREIGN PATENT DOCUMENTS

| CN | 1734320 A | 2/2006 |
| CN | 102206046 A | 10/2011 |

(Continued)

OTHER PUBLICATIONS

PCT International Search Report, Application No. PCT/CN2019/081196, dated Dec. 13, 2019, 7 pages: with English translation.

(Continued)

*Primary Examiner* — Lex H Malsawma
(74) *Attorney, Agent, or Firm* — Armstrong Teasdale LLP

(57) ABSTRACT

The embodiments of the present disclosure relate to a display panel and a display device. The display panel includes a plurality of wirings extending parallel to a display substrate of the display panel, and a plurality of light-shielding portions extending parallel to the display substrate, wherein orthographic projections of at least two wirings of the plurality of wirings with parallel extending directions on the display surface are within an orthographic projection of a same light-shielding portion on the display substrate, wherein at least a portion of each light-shielding portion has a curved profile along the extending direction.

19 Claims, 19 Drawing Sheets

(56) References Cited

U.S. PATENT DOCUMENTS

| | | | |
|---|---|---|---|
| 2007/0263159 | A1 | 11/2007 | Kobayashi et al. |
| 2013/0265774 | A1 | 10/2013 | Umeda et al. |
| 2014/0146094 | A1 | 5/2014 | Koide |
| 2016/0187717 | A1 | 6/2016 | Hosokawa et al. |
| 2017/0069696 | A1 | 3/2017 | Kondo |
| 2017/0192279 | A1* | 7/2017 | Maede .............. G02F 1/136286 |
| 2018/0348555 | A1 | 12/2018 | Okita |
| 2019/0278129 | A1 | 9/2019 | Zhu et al. |

FOREIGN PATENT DOCUMENTS

| | | |
|---|---|---|
| CN | 103718069 A | 4/2014 |
| CN | 103995380 A | 8/2014 |
| CN | 107850787 A | 3/2018 |
| CN | 107871756 A | 4/2018 |
| CN | 108682299 A | 10/2018 |
| JP | 2006243261 A | 9/2006 |

OTHER PUBLICATIONS

PCT Written Opinion, Application No. PCT/CN2019/081196, dated Dec. 13, 2019, 7 pages.: with English translation of relevant part.
China First Office Action, Application No. 201980000455.4, dated Dec. 2, 2021, 17 pps.: with English translation.
U.S. Non-Final Office Action, U.S. Appl. No. 16/652,576, dated Dec. 20, 2021, 13 pages.

* cited by examiner

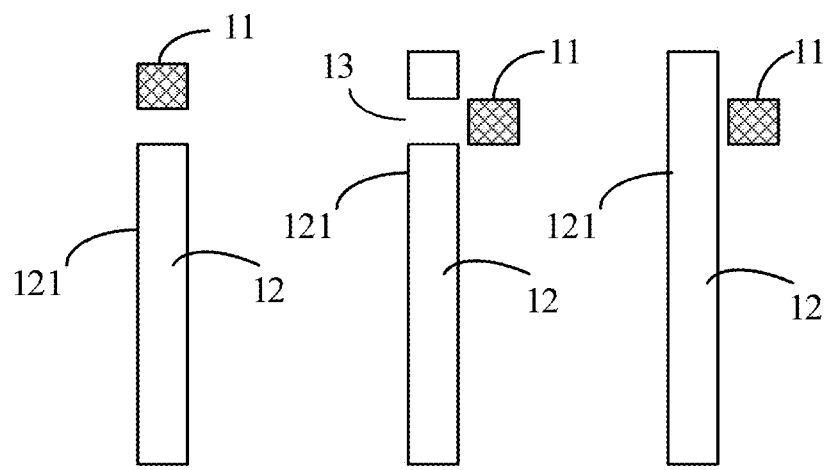
FIG. 1A  FIG. 1B  FIG. 1C
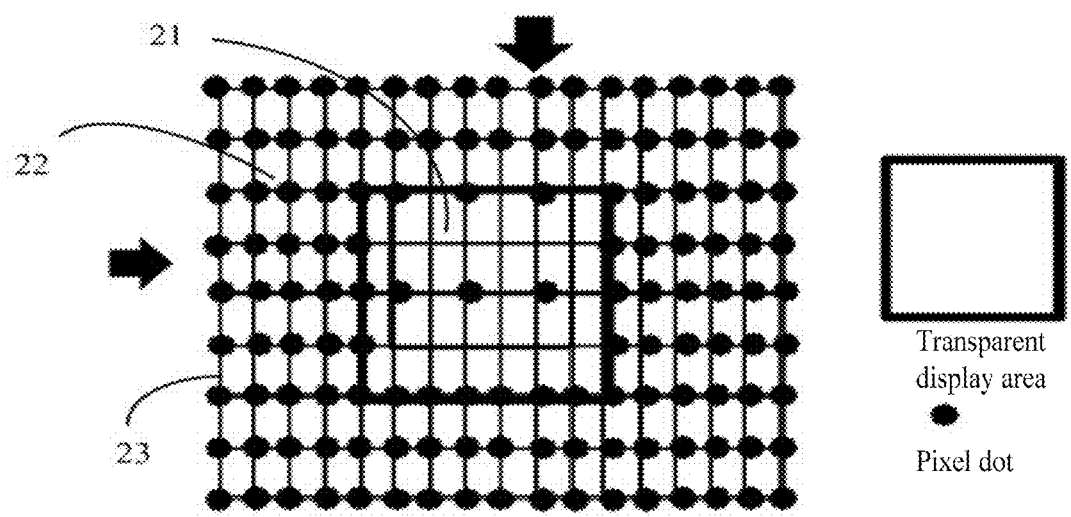
FIG. 2

DISPLAY PANEL AND DISPLAY DEVICE
WITH CURVED LIGHT-SHIELDING
PORTIONS

CROSS REFERENCE TO RELATED
APPLICATIONS

This patent application is a continuation-in-part application of U.S. patent application Ser. No. 16/652,576 filed on Mar. 31, 2020, which is a National Stage Entry of PCT/CN2019/081196 filed on Apr. 3, 2019, the disclosures of which are incorporated by reference herein in their entirety as part of the present application.

BACKGROUND

Embodiments of the present disclosure relate to a field of display technology, and in particular, to a display panel and a display device.

Mobile terminals such as mobile phones typically include a display panel and an imaging element. With the progress of society and the continuous improvement of living standards, people's requirements for mobile terminals are also increasing. The screen ratio of a mobile terminal (the ratio of the area of the display region of the display panel to the area of the surface of the entire mobile terminal) is constantly increasing, and it is moving towards full screen display.

BRIEF DESCRIPTION

An aspect of the present disclosure provides a display panel including a first area and a second area located at least on a side of the first area, wherein a light transmittance of the first area is greater than a light transmittance of the second area, a substrate at least located in the first area and the second area, a plurality of wirings located on a side of the substrate and at least in the first area, and a light-shielding portion located on the side of the substrate and including at least one first light-shielding portion located in the first area and extending in a first direction, wherein, orthographic projections of portions, extending in the first direction, of at least two of the plurality of wirings on the substrate are within an orthographic projection of the at least one first light-shielding portion on the substrate, and the orthographic projection of at least a portion of the at least one first light-shielding portion on the substrate has a curved profile.

In some embodiments, the light-shielding portion further includes at least one second light-shielding portion located in the first area and extending in a second direction, and orthographic projections of portions, extending in the second direction, of at least two of the plurality of wirings on the substrate are within an orthographic projection of the at least one second light-shielding portion on the substrate, and the orthographic projection of at least a portion of the at least one second light-shielding portion on the substrate has a curved profile.

In some embodiments, the at least one first light-shielding portion includes at least one intersection portion at an intersection position of the at least one first light-shielding portion and the at least one second light-shielding portion, and at least one first extension portion extending in the first direction, and the at least one second light-shielding portion includes the at least one intersection portion and at least one second extension portion extending in the second direction.

In some embodiments, a maximum width, in the first direction, of each of the at least one intersection portion is greater than a maximum width, in the first direction, of the second extension portion of the at least one second light-shielding portion. In addition or alternatively, and a maximum width, in the second direction, of each of the at least one intersection portion is greater than a maximum width, in the second direction, of the first extension portion of the at least one first light-shielding portion.

In some embodiments, the display panel further including a plurality of light-transmitting areas located in the first area, wherein orthographic projections of the plurality of light-transmitting areas on the substrate do not overlap with the orthographic projection of the light-shielding portion on the substrate.

In some embodiments, the display panel further including at least one pixel island located in the first area, each pixel island including at least one pixel, wherein an orthographic projection of the at least one pixel island on the substrate is within an orthographic projection of the at least one intersection portion on the substrate.

In some embodiments, wirings of the plurality of wirings extending in the first direction include one or more of a data line, an initial signal line, a power supply line and a combination thereof, and wirings of the plurality of wirings extending in the second direction include one or more of a gate line, a reset line, a light emission control line and a combination thereof.

In some embodiments, the at least two wirings at least include adjacent first wiring group and second wiring group extending in the first direction, the first wiring group and the second wiring group each including at least one wiring, and a minimum distance between portions of the first wiring group and of the second wiring group overlapping with the intersection portion is greater than a minimum distance between portions of the first wiring group and of the second wiring group overlapping with the first extension portion.

In addition or alternatively, the at least two wirings at least include adjacent third wiring group and fourth wiring group extending in the second direction, the third wiring group and fourth wiring group each including at least one wiring, and a minimum distance between portions of the third wiring group and of the fourth wiring group overlapping with the intersection portion is greater than a minimum distance between portions of the third wiring group and of the fourth wiring group overlapping with the second intersection portion.

In some embodiments, the at least a portion of the at least one first light-shielding portion includes at least a portion of an edge of the first extension portion or an edge of the intersection portion, and the at least a portion of the at least one second light-shielding portion includes at least a portion of an edge of the second extension portion or an edge of the intersection portion.

In some embodiments, the curved profile is at least one of a wave shape, a sawtooth shape, a sharp pulse shape, and a shape formed by circular arcs arranged in succession, and wherein the wave shape includes a plurality of wave units.

In some embodiments, a curvature radius of at least one of the plurality of wave units at a peak is 5-10 μm.

In some embodiments, the at least one first light-shielding portion has a symmetrical shape with respect to an axis parallel to the first direction. In addition or alternatively, the at least one second light-shielding portion has a symmetrical shape with respect to an axis parallel to the second direction.

In some embodiments, the first light-shielding portion includes two wave-shaped edges opposite each other in a direction perpendicular to an extending direction of the first light-shielding portion, and peaks of the wave units of one of the two wave-shaped edges of the first light-shielding portion are aligned with peaks or troughs of the wave units of the other one of the two wave-shaped edges of the first light-shielding portion. In addition or alternatively, the second light-shielding portion includes two wave-shaped edges opposite each other in a direction perpendicular to an extending direction of the second light-shielding portion, and peaks of the wave units of one of the two wave-shaped edges of the second light-shielding portion are aligned with peaks or troughs the wave units of the other one of the two wave-shaped edges of the second light-shielding portion.

In some embodiments, the at least one first light-shielding portion includes a plurality of first light-shielding portions, and peaks of the wave units of one of two adjacent first light-shielding portions are aligned in the second direction with peaks or troughs of the wave units of the other one of the two adjacent first light-shielding portions. In addition or alternatively, the at least one second light-shielding portion includes a plurality of second light-shielding portions, and peaks of the wave units of one of two adjacent second light-shielding portions are aligned in the first direction with peaks or troughs of the wave units of the other one of the two adjacent second light-shielding portions.

In some embodiments, a minimum distance between the two adjacent first light-shielding portions is greater than 80 μm. In addition or alternatively, a minimum distance between the two adjacent second light-shielding portions is greater than 80 μm.

In some embodiments, a minimum distance between the two adjacent first light-shielding portions is greater than 120 μm. In addition or alternatively, a minimum distance between the two adjacent second light-shielding portions is greater than 120 μm.

In some embodiments, both the first area and the second area include a plurality of pixels, and a density of pixels in the first area is less than or equal to a density of pixels in the second area.

In some embodiments, the first wiring group and the second wiring group supply signals to different pixels in a same pixel island. In addition or alternatively, the third wiring group and the fourth wiring group supply signals to same pixels in the same pixel island.

In some embodiments, the display panel further including an additional film layer located in the second area and extending to the first area, wherein an orthographic projection of the light-shielding portion on the substrate is within an orthographic projection of the additional layer on the substrate.

In some embodiments, the at least one pixel includes a thin film transistor, wherein the light-shielding portion is located between the thin film transistor and the substrate, and an orthographic projection of the thin film transistor on the substrate is within an orthographic projection of the light-shielding portion on the substrate.

Another aspect of the present disclosure provides a display device including the display panel according to any one of one or more embodiments of the present disclosure. The display device further including an imaging element located on a side of the display panel away from the display surface, wherein an orthographic projection of the imaging element on the display panel is at least partially located within the first area.

Further aspects and areas of applicability will become apparent from the description provided herein. It should be understood that various aspects of this disclosure may be implemented individually or in combination with one or more other aspects. It should also be understood that the description and specific examples herein are intended for purposes of illustration only and are not intended to limit the scope of the present disclosure.

BRIEF DESCRIPTION OF THE DRAWINGS

The drawings described herein are for the purpose of illustration of selected embodiments only, not for all possible implementations, and are not intended to limit the scope of the disclosure, wherein:

FIGS. 1A-1C schematically illustrate three relative positions of the imaging element with respect to the display panel;

FIG. 2 is a schematic view of a partially transparent display panel;

Corresponding reference numerals indicate corresponding parts or features throughout the several views of the drawings.

DETAILED DESCRIPTION

Figure 3:
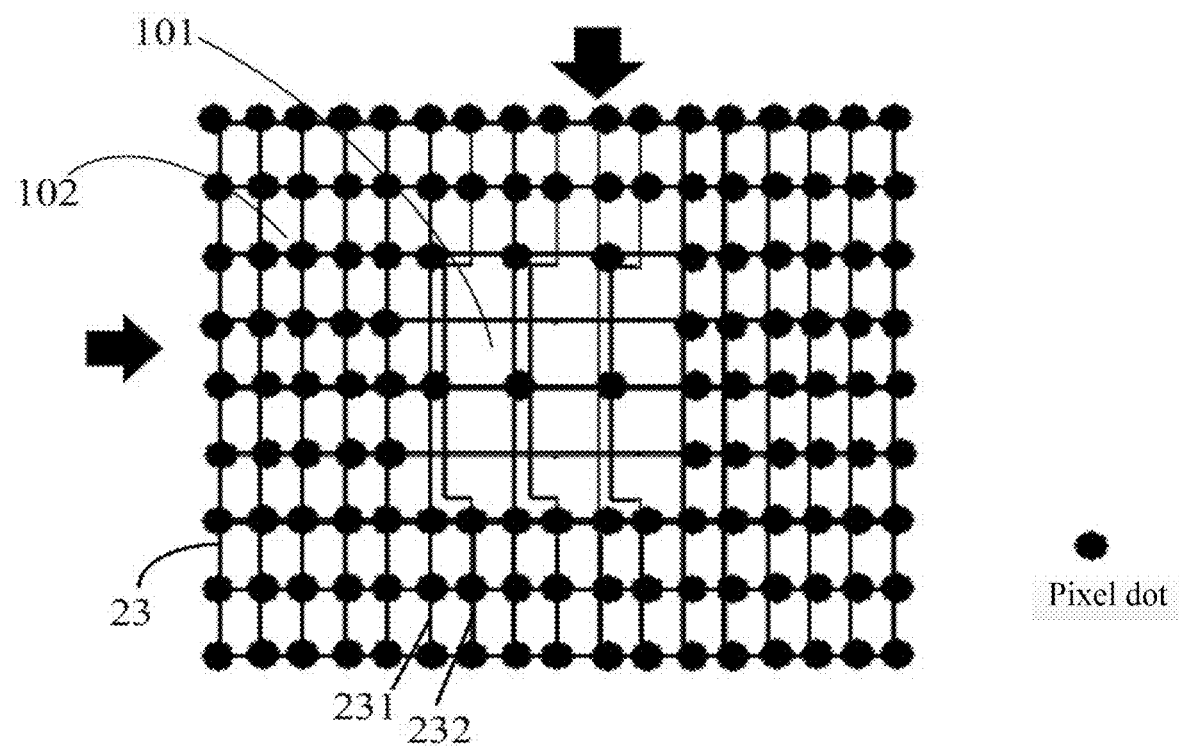
FIG. 3 is a schematic view of another partially transparent display panel.

Various embodiments will now be described in detail with reference to the drawings, which are provided as illustrative examples of the disclosure so as to enable those skilled in the art to practice the disclosure. Notably, the figures and the examples below are not meant to limit the scope of the present disclosure. Where certain elements of the present disclosure may be partially or fully implemented using known components, only those portions of such known components that are necessary for an understanding of the present disclosure will be described, and the detailed descriptions of other portions of such known components will be omitted so as not to obscure the disclosure. Further, various embodiments encompass present and future known equivalents to the components referred to herein by way of illustration.

Generally, an arranging position of an imaging element will affect the screen ratio of the mobile terminal. FIGS. 1A-1C schematically illustrate three relative positions of the imaging element with respect to the display panel. In the first configuration shown in FIG. 1A, an imaging element 11 is disposed on the periphery of the display panel 12, so the imaging element 11 occupies extra space, which is not conducive to increasing the screen ratio. In the second configuration shown in FIG. 1B, the imaging element 11 is disposed on the back of the display panel 12 (a side of the display panel away from the display surface 121), which may increase the screen ratio to a certain extent. However, such a configuration requires a blank area 13 (where no pixel is provided) at a position of the display panel 12 corresponding to the imaging element 11, and the imaging element 11 may capture an image of an object in front of the display panel 12 through the blank area 13. Although the second configuration may increase the screen ratio to a certain extent compared to the first configuration, it still cannot achieve full screen display. In the third configuration shown in FIG. 1C, similarly to the second configuration, the imaging element 11 is disposed on the back of the display panel 12, but the area of the display panel 12 corresponding to the imaging element 11 can still display an image with being at least partially light-transmitting. In this case, the display panel includes a transparent display area 21 and a non-transparent display area 22, and the imaging element 11 is located at a position corresponding to the transparent display area 21 of the display panel. This may be achieved by reducing the ppi (pixels per inch) of the area corresponding to the imaging element 11 of the display panel 12 so that ambient light may pass through the display panel 12.

It should be noted that, the term "transparent" as used herein generally refers to being light-transmitting by a certain transmittance to light (for example, visible light). By way of example, the transmittance ranges from 10% to 90%. The term "transparent display area" refers to a light-transmitting display area of the display panel in which the light transmittance is, for example, in the range of 10% to 90%, and the term "non-transparent display area" refers to a non-transmitting area of the display panel in which the light transmittance is, for example, less than 10%.

FIG. 2 is a schematic view of a partially transparent display panel. As shown in FIG. 2, in order to achieve partial transparent display of the display panel, some pixels may be removed from the transparent display area 21 to reduce the ppi of the transparent display area 21 (the area enclosed by the thick solid line in FIG. 2). In FIG. 2, pixels may be schematically represented by pixel points. As an example, the number of pixels per inch (PPI) in the transparent display area 21 may be reduced to half the number of the pixels per inch in the non-transparent display area 22. As a further example, in the transparent display area 21, rows/columns with pixels and rows/columns without pixels are arranged alternately each other. In the partially transparent display panel shown in FIG. 2, the wirings in the transparent display area 21 and the non-transparent display area 22 are arranged in exactly the same way, which results in that the wiring density in the transparent display area 21 is not reduced compared with that of the non-transparent display area 22, thereby adversely affecting the transparent display effect and the imaging quality of the imaging element to a certain extent.

As used herein, the term "partially transparent display" refers to partial light-transmitting display, in which a partial area of the display panel has a light transmittance, for example, in the range of about 10% to 90%. The light-transmitting area (i.e., the transparent display area 21) of the display panel may be located within the non-light-transmitting area (the non-transparent display area 22), and be fully surrounded by the non-light-transmitting area. Alternatively, the light-transmitting area of the display panel may be arranged on at least one side of the non-light-transmitting area, and may be partially surrounded by the non-light-transmitting area.

FIG. 3 is a schematic view of another partially transparent display panel. As shown in FIG. 3, wirings 231 and 232 that supply signals to pixels of the transparent display area 21 and the non-transparent display area 22 are more adjacent to each other in the transparent display area 21. This configuration may improve the display effect and the imaging quality of the imaging element to a certain extent. However, since the distance between the two wirings 231 and 232 moving closer to each other in the transparent display area is usually small, and the smaller the gap, the easier it is to cause diffraction of the light passing through, so the display effect of the display panel and the imaging quality of the imaging element are also adversely affected.

Figure 4A:
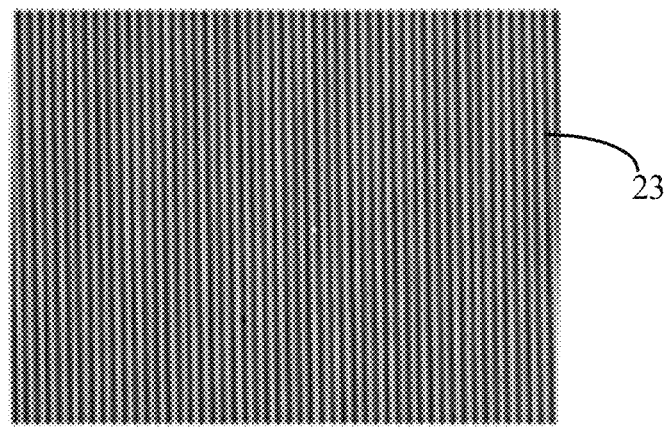
FIGS. 4A and 4B schematically illustrate the wirings arranged in the longitudinal direction and the imaging effect of the corresponding imaging element, respectively.
Figure 4B:

FIGS. 4A and 4B schematically illustrate wirings arranged in a longitudinal direction and imaging effect of the corresponding imaging element, respectively. As shown in FIGS. 4A and 4B, in the case where the wirings are arranged in parallel and densely, the sharpness of the image acquired by the imaging element will be affected, making the image quality deteriorated.

Figure 5A:
FIGS. 5A and 5B illustrate wirings having regular strip-shapes and arranged in parallel and imaging effect of the corresponding imaging element, respectively.
Figure 6A:
FIGS. 6A and 6B illustrate wirings having irregular strip-shapes and arranged in parallel and imaging result of corresponding imaging elements, respectively.
Figure 5B:
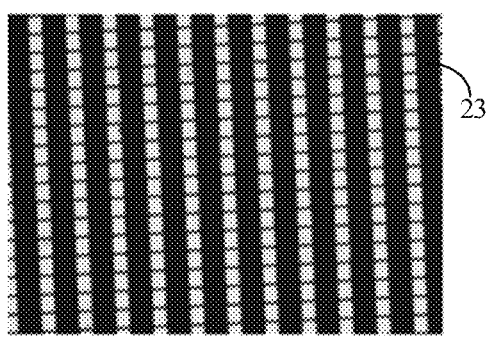
Figure 6B:
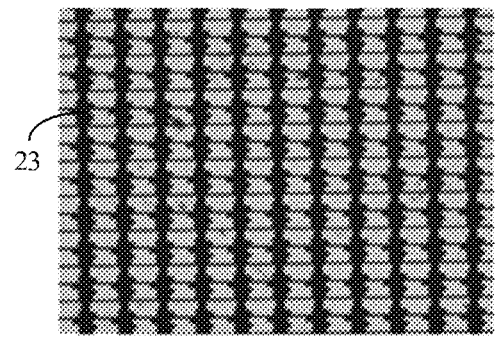

In addition, the inventors found that in addition to the density of the wirings, the shape of the wirings also affects the image quality acquired by the imaging element. FIGS. 5A and 5B illustrate wirings having regular strip-shapes and arranged in parallel and the imaging effect views of the corresponding imaging element, respectively. FIGS. 6A and 6B illustrate wirings having irregular strip-shapes and arranged in parallel and the imaging effect of the corresponding imaging element, respectively. As shown in FIGS. 5A and 5B, in the case where the wirings 21 are regularly strip-shaped wirings, the imaging effect is relatively poor. As shown in FIGS. 6A and 6B, in the case where the wirings 21 are irregularly strip-shaped wirings, the imaging effect is improved compared to the regularly strip-shaped wirings.

An aspect of the present disclosure provides a display panel. In the case where the display panel is applied to a display device equipped with an imaging element, the diffraction effect of light on the wirings may be reduced. Therefore, the adverse effect on the imaging effect caused by the diffraction effect of the wirings may be reduced, and at the same time, a full screen display may be realized.

Figure 7:
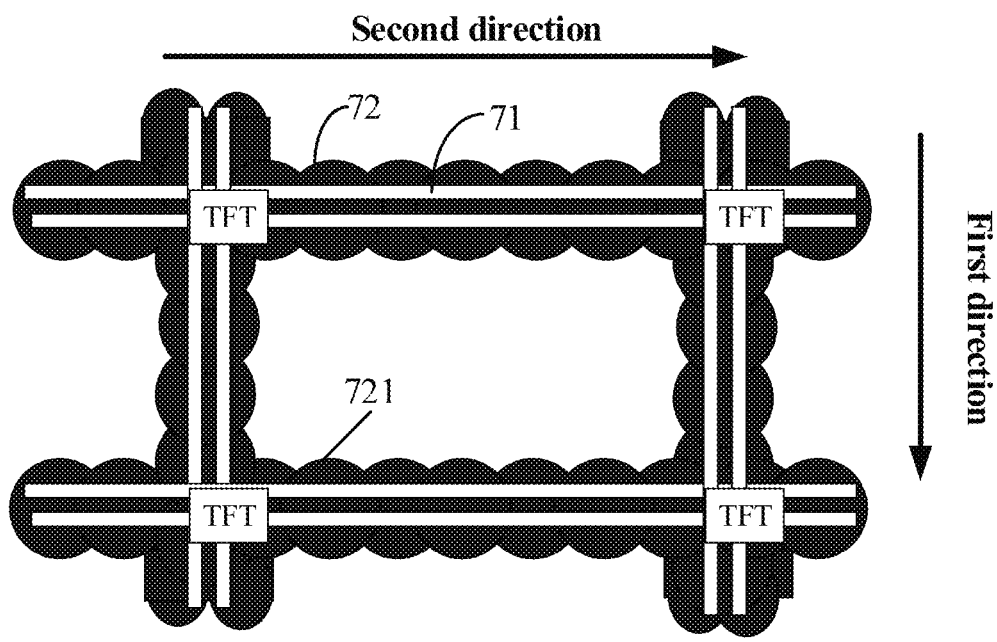
FIG. 7 schematically illustrates a partial structural view of a display panel in one or more embodiments of the present disclosure.

FIG. 7 schematically illustrates a partial structural view of a display panel in one or more embodiments of the present disclosure. As shown in FIG. 7, the display panel may include a plurality of wirings 71 extending parallel to a display substrate of the display panel, and a plurality of light-shielding portions 72 extending parallel to the display substrate of the display panel. The orthographic projections of at least two wirings 71 of the plurality of wirings 71 extending parallel to each other on the display substrate of the display panel are within the orthographic projection of a same light-shielding portion 72 on the display substrate. At least a portion of each light-shielding portion 72 has a curved profile along the extending direction.

In some embodiments of the present disclosure, the extending direction may include at least one of a first direction and a second direction intersecting the first direction. As an example, the wirings 71 may include wirings extending in a first direction and wirings extending in a second direction. As yet another example, the wirings may be arranged only in the first direction or only in the second direction. The first direction and the second direction may be perpendicular to each other. In some embodiments of the present disclosure, the wirings 71 may include a plurality of gate lines, a plurality of data lines, and the like. The plurality of gate lines extend in one of the first direction and the second direction, and the plurality of data lines extend in the other of the first direction and the second direction. In addition, at the intersection of the wiring extending in the first direction and the wiring extending in the second direction, an electronic component such as a thin film transistor (TFT) may be provided.

As a non-limiting example, both the light-shielding portion 72 and the wiring 71 may be made of a metal material. In this case, an insulation layer may be provided between the light-shielding portion 72 and the wiring 71 to prevent the light-shielding portion from adversely affecting the transmission signal on the wiring 71. Alternatively, the light-shielding portion may also be formed of an insulation material.

In the case where a display panel provided according to some embodiments of the present disclosure is applied to a display device equipped with an imaging element, each light-shielding portion 72 may shield at least two wirings 71. Therefore, it is possible to prevent the ambient light from diffracting at the gap between the at least two wirings 71, thereby reducing the adverse effect on the imaging quality of the imaging element and the display effect of the display panel due to the diffraction of light. In addition, an object with a sharp boundary may also have a diffractive effect on light. In some embodiments of the present disclosure, the light-shielding portions are designed to have a curved profile and the sharp boundaries of the light-shielding portions may be at least partially eliminated. Therefore, it is possible to further reduce the diffraction phenomenon of light by the light-shielding portions.

In some exemplary embodiments, as shown in FIG. 7, the curved profile of the light-shielding portion 72 has, for example, a wave shape along the extending direction of the light-shielding portion 72. As shown in FIG. 7, the wave-shaped curved profile may include a plurality of wave units 720. Since the light-shielding portion with a wavy profile has a relatively smooth boundary, the phenomenon of light diffraction can be reduced and the display effect of the display panel and the imaging quality of the imaging element can be improved.

Figure 8:
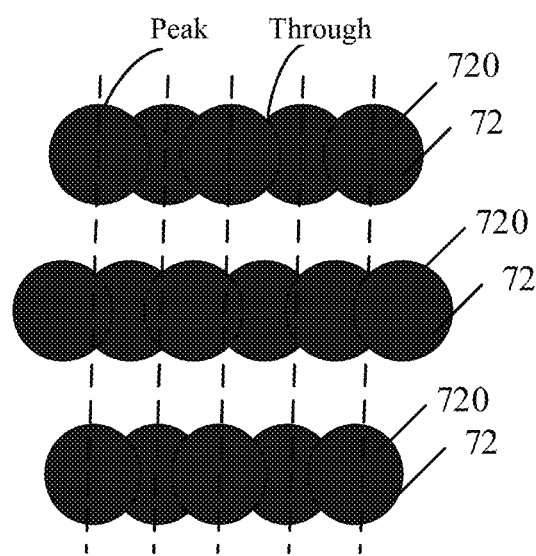
FIG. 8 schematically illustrates an example alignment relationship of peaks and troughs of adjacent wave-shaped light-shielding portions in one or more embodiments of the present disclosure.

In some embodiments, each light-shielding portion 72 has a symmetrical shape with respect to an axis parallel to a direction in which it extends. That is, the light-shielding portion 72 has an axisymmetric pattern. As shown in FIG. 7, a peak of the wave unit 720 of one of the two adjacent light-shielding portions 72 extending in parallel is aligned with a peak of the wave unit 720 of the other one of the two adjacent light-shielding portions in a direction perpendicular to the extending direction. As another example, a peak of the wave unit 720 of one of the two adjacent light-shielding portions 72 extending in parallel may not be aligned with a peak of the wave unit 720 of the other one of the two adjacent light-shielding portions in a direction perpendicular to the extending direction. FIG. 8 schematically illustrates an example alignment relationship of peaks and troughs of adjacent wave-shaped light-shielding portions in one or more embodiments of the present disclosure. As shown in FIG. 8, peaks of the wave units 720 of one of the two adjacent light-shielding portions 72 with parallel extending directions are aligned with troughs of the wave units 720 of the other one of the two adjacent light-shielding portions in a direction perpendicular to extending directions.

Figure 9:
FIG. 9 schematically illustrates a portion of a wave-shaped curved profile in one or more embodiments of the present disclosure.

FIG. 9 schematically illustrates a portion of a wave-shaped curved profile in one or more embodiments of the present disclosure. As shown in FIG. 9, the curvature radius R of each wave unit 720 at the peak is in a range of 5-10 µm. The width d of each wave unit 720 is in a range of 4-7 µm. In the embodiments of the present disclosure, the width of each wave unit 720 is the distance between two adjacent peaks or troughs.

In some embodiments, a distance between two adjacent light-shielding portions with parallel extending directions is greater than 80 µm. As another embodiment, a distance between two adjacent light-shielding portions with parallel extending directions is greater than 120 µm. A large distance between adjacent light-shielding portions makes it is possible to reduce light diffraction at a gap between the light-shielding portions. It should be noted that in some embodiments of the present disclosure, the distance between two adjacent light-shielding portions 72 with the same extending direction may refer to a straight-line distance between the closest edges of the two light-shielding portions 72, that is, the minimum distance between the edges of two adjacent light-shielding portions.

Figure 10:
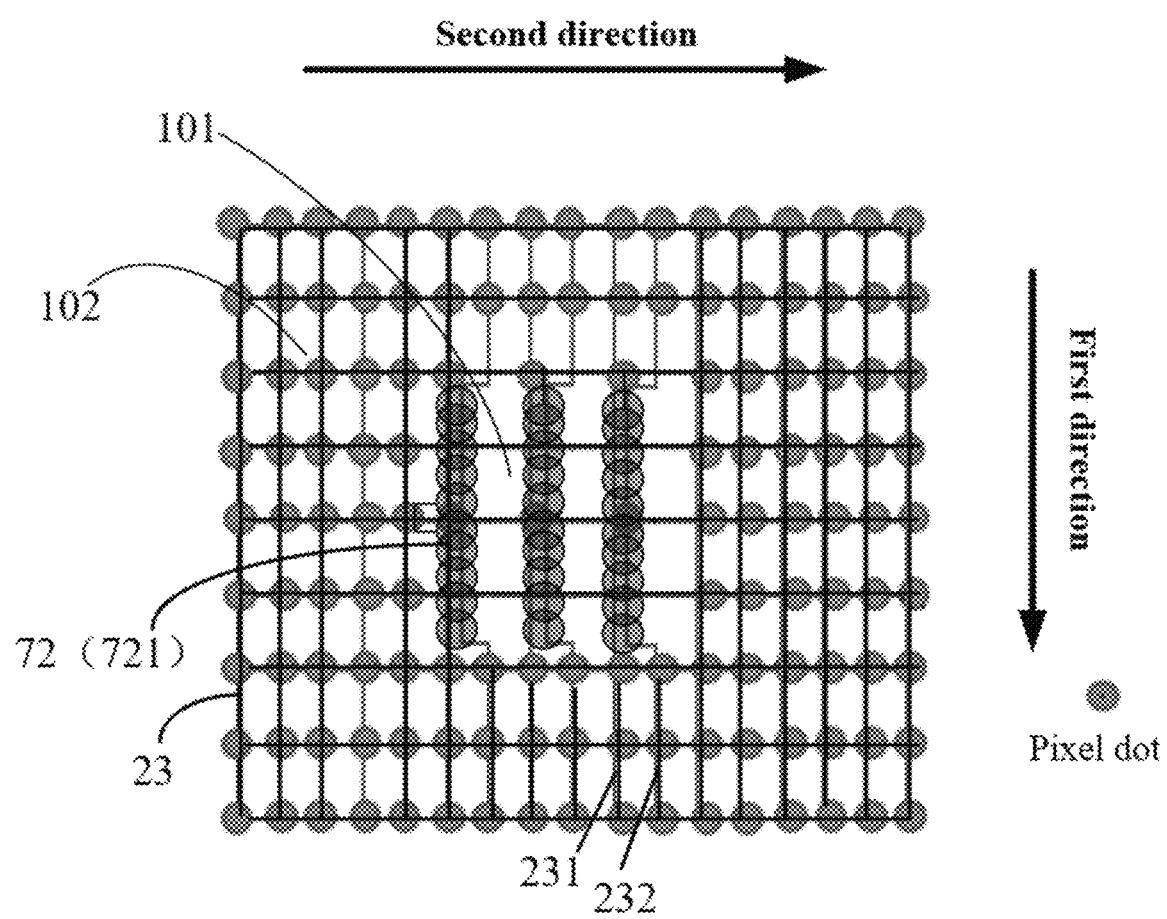
FIG. 10 schematically illustrates a partial structural view of another display panel in one or more embodiments of the present disclosure.

FIG. 10 schematically illustrates a partial structure view of another display panel in one or more embodiments of the present disclosure. As shown in FIG. 10, the another display panel has a first area 101 and a second area 102. The light transmittance of the first area 101 is greater than the light transmittance of the second area 102. In this embodiment, the another display panel may further include a substrate (not shown in FIG. 10) located at least in the first area 101 and the second area 102. The plurality of wirings 71 are provided on a side of the substrate, and at least in the first area 101. In one or more embodiments of the present disclosure, the plurality of wirings may be provided in both the first area 101 and the second area 102. The light-shielding portion 72 may be located on a same side of the substrate as the plurality of wirings 71 in the first area 101.

In one or more embodiments of the present disclosure, each of the first area 101 and the second area 102 may have a plurality of pixels. In an exemplary embodiment, the light transmittance of the first area 101 may be increased by reducing a density of pixels in the first area 101. In other words, the density of pixels of the first area 101 is smaller than that of the second area 102. In yet another exemplary embodiment, the light transmittance of the first area 101 may be increased by reducing the size (or area) of the pixels in the first area 101. In other words, the size (or area) may be smaller than that in the second area 102. In this case, the density of pixels in the first area 101 may be equal to the density of pixels in the second area 102. In this embodiment, the first area 101 may function as the transparent display area of the display panel, and the second area 102 may function as the non-transparent display area of the display panel.

Continuing to refer to FIG. 10, the light-shielding portion 72 may include at least one first light-shielding portion 721 located in the first area 101 and extending along the first direction. Orthographic projections of at least portions, extending along the first direction, of at least two (for example, wirings 231 and 232) of the plurality of wirings 71 are within an orthographic projection of the at least one first light-shielding portion 721 on the substrate. The orthographic projection of at least a portion of the at least one first light-shielding portion 721 on the substrate has a curved profile.

Continuing to refer to FIG. 10, the at least two wirings corresponding to the same first light-shielding portion 721 may include a first wiring 231 and a second wiring 232 extending in the first direction. In this embodiment, in order to improve the display effect of the transparent display area and the imaging quality of the imaging element located behind the transparent display area, the second wiring 232 is more adjacent to the first wiring 231 in the first area 101 in a second direction perpendicular to the first direction than other wirings extending in the first direction, and the second wiring 232 in the first area 101 is more adjacent to the first wiring 231 than in the second area 102.

In one or more embodiments of the present disclosure, both the first wiring 231 and the second wiring 232 may supply signals to the pixels in the first area 101, but not supply signals to a same pixel in the first area at the same time. In an exemplary embodiment, the first wiring 231 supplies a signal to the pixels in the first area 101 and the second area 102, and the second wiring 232 supplies a signal to pixels in the second area 102 but not supplies the signal to pixels in the first area 101. In other words, the second wiring 232 may be connected to the pixels in the second area 102 around the imaging element, but not be electrically connected to the pixels in the first area 101 corresponding to the imaging element.

Figure 11:
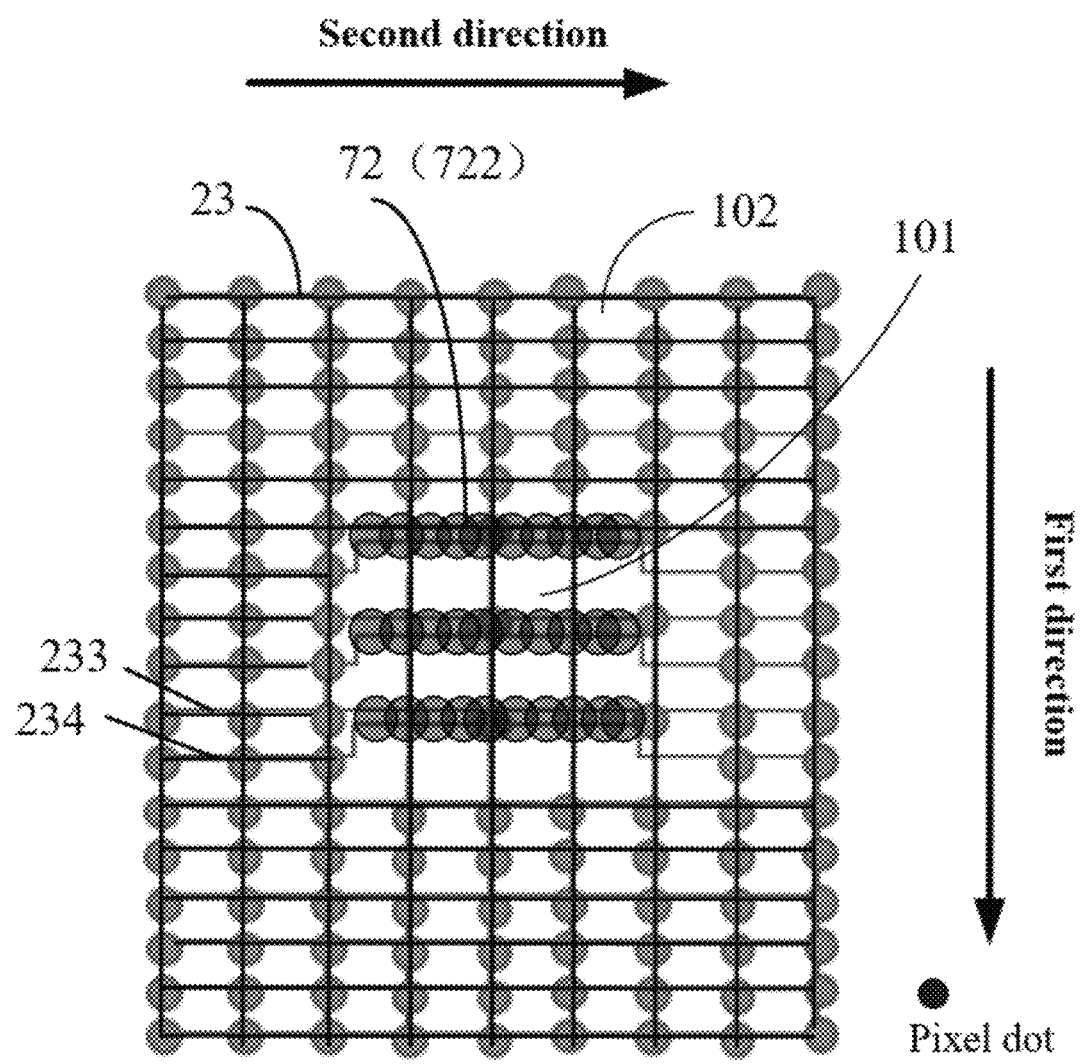
FIG. 11 schematically illustrates a partial structural schematic view of still another display panel in one or more embodiments of the present disclosure.

FIG. 11 schematically illustrates a partial structural view of yet another display panel in one or more embodiments of the present disclosure. The configuration of the display panel shown in FIG. 11 is substantially the same as that shown in FIG. 10 except for the arrangement of the light-shielding portion 72 and the wirings 71 in the first area 101. Therefore, in this embodiment, only the parts different from those of the embodiment shown in FIG. 10 will be described, while the same parts as those of the embodiment shown in FIG. 10 may refer to the description with respect to FIG. 10.

As shown in FIG. 11, the light-shielding portion 72 may include at least one second light-shielding portion 722 located in the first area 101 and extending in the second direction. Orthographic projections of portions, extending in the second direction, of the at least two (for example, wirings 233 and 234) of the plurality of wirings 71 are within an orthographic projection of the at least one second light-shielding portion 722 on the substrate. The orthographic projection of at least a portion of the at least one second light-shielding portion 722 on the substrate has a curved profile.

As shown in FIG. 11, the at least two wirings corresponding to the same light-shielding portion 72 may further include a third wiring 233 and a fourth wiring 234 extending in the second direction. In this embodiment, in order to improve the display effect of the transparent display area and the imaging quality of the imaging element located behind the transparent display area, the fourth wiring 234 is more adjacent to the third wiring 233 in the first area 101 than other wirings extending in the second direction. The third wiring 233 is closer in one direction, and the fourth wiring 234 in the first area 101 is more adjacent to the third wiring 233 than in the second area 102

In one or more embodiments of the present disclosure, both the third wiring 233 and the second wiring 234 may supply signals to pixels in the first area 101, but do not supply signals to a same pixel in the first area 101 at the same time. In an exemplary embodiment, the third wiring 233 supplies a signal to the pixels in the first area 101 and the second area 102, and the fourth wiring 234 supplies a signal to pixels in the second area 102 but does not supply the signal to pixels in the first area 101. In other words, the fourth wiring 233 may be connected to the pixels in the second area 102 around the imaging element, but not be electrically connected to the pixels in the first area 101 corresponding to the imaging element.

Figure 16:
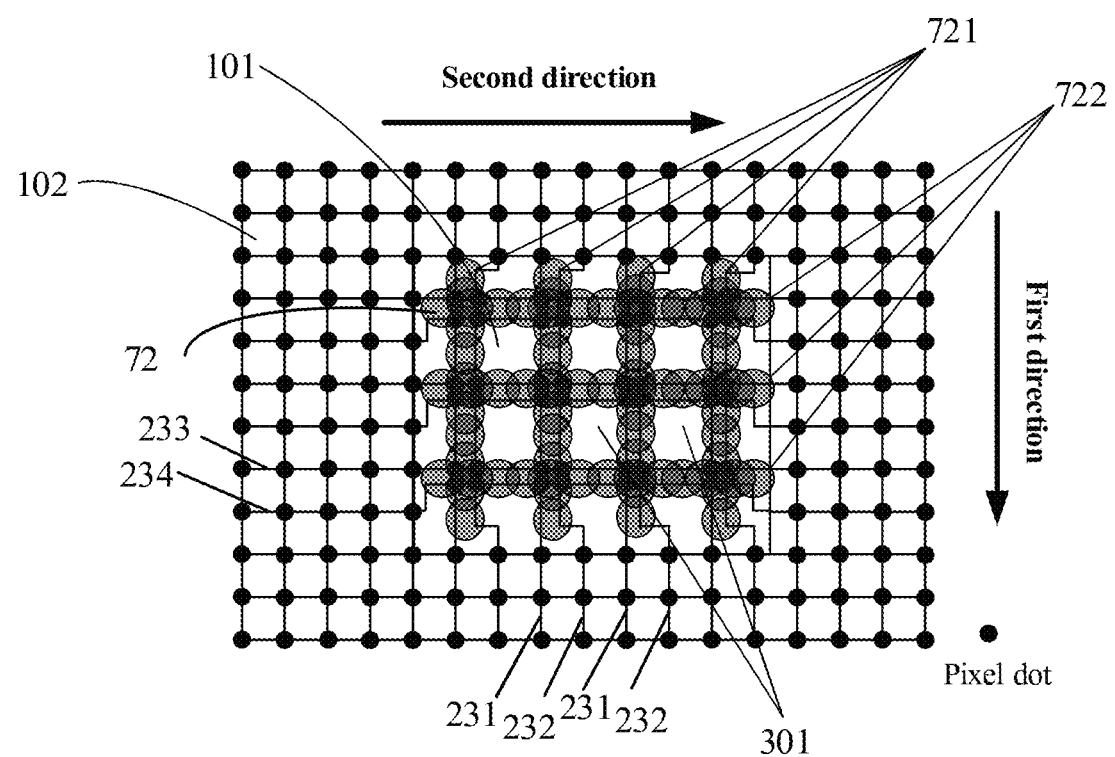
FIG. 16 schematically illustrates a partial structural view of yet another display panel in one or more embodiments of the present disclosure.

In another embodiment, the display panels in the embodiments shown in FIGS. 10 and 11 may be combined. FIG. 16 schematically illustrates a partial structural schematic view of yet another display panel in one or more embodiments of the present disclosure. As illustrated in FIG. 16, the light-shielding portion 72 may include at least one first light-shielding portion 721 extending in the first direction and at least one second light-shielding portion 722 extending in the second direction. The second wiring 232 is closer to the first wiring 231 in the first area 101 in a second direction perpendicular to the first direction compared to other wires extending in a first direction, while the fourth wiring 234 is closer to the third wiring 233 in the first area 101 in the first direction compared with other wirings extending in the second direction. each first light-shielding portion 721 overlaps with a pair of adjacent first wiring 231 and second wiring 232 in the thickness direction of the display panel; and each second light-shielding portion 722 overlaps with a pair of adjacent third wiring 233 and fourth wiring 234 in the thickness direction of the display panel.

With the above configuration, the light-shielding portion 72 shields the two wirings adjacent to each other, reducing the diffraction of light by the gap between the two wirings adjacent to each other. On the other hand, the use of the light-shielding portion 72 with a curved profile can also reduce the diffraction of light by the edges of the light-shielding portion itself. Therefore, the display effect of the transparent display area and the imaging effect of the imaging element can be further improved.

With further reference to FIGS. 10, 11, and 16, the display panel may further include a plurality of light-transmitting areas 301 located in the first area 101. Orthographic projections of the plurality of light-transmitting areas 301 on the substrate and the orthographic projection of the light-shielding portion 72 on the substrate do not overlap. In one or more embodiments of the present disclosure, the plurality of light-transmitting areas 301 may be opening areas defined by light-shielding portion. As an example, the light-transmitting regions 301 correspond to the multiple opening regions in the first area 101 except for the light-shielding portion, and these opening areas are formed by intersecting a plurality of first light-shielding portions 721 and a plurality of second light-shielding portions 722 as shown in FIG. 16. In the light-transmitting areas 301, no pixel may be provided. In this way, more light (e.g., ambient light) may enter the imaging element located on a back side of the display panel through the light-transmitting areas 301, so that it can be utilized by the imaging element.

It should be noted that four first light-shielding portions 721 and three second light-shielding portions 722 are shown in the embodiments shown in FIGS. 10, 11, and 16. However, it shall be understood that the number of the first light-shielding portions 721 and the second light-shielding portions 722 is not limited thereto, and there may be more or less first light-shielding portions 721 and second light-shielding portions 722, for example, 5-10 first light-shielding portions 721 and 5-10 second light-shielding portions 722.

In one or more embodiments of the present disclosure, one first light-shielding portion 721 or one second light-shielding portion 722 corresponds to two wirings. However, it can be understood that one first light-shielding portion 721 or one second light-shielding portion 722 may correspond to more wirings, for example, 3-6 wirings.

In an exemplary embodiment of the present disclosure, the wirings (for example, the first wiring 231 and the second wiring 232) of the plurality of wirings extending in the first direction may include one or more of data lines, initial signal lines, and power supply lines and a combination thereof; and the wirings (for example, the third wiring 233 and the third wiring 234) of the plurality of wirings extending in the second direction may include one or more of gate lines, reset lines, or light emission control lines and a combination thereof. It should be noted that the types of wirings are not limited to gate lines, reset lines, light emission control lines, data lines, initial signal lines or power supply lines, and may also include any other wirings that may supply signals to the display panel in the embodiments of the present disclosure.

Figure 12A:
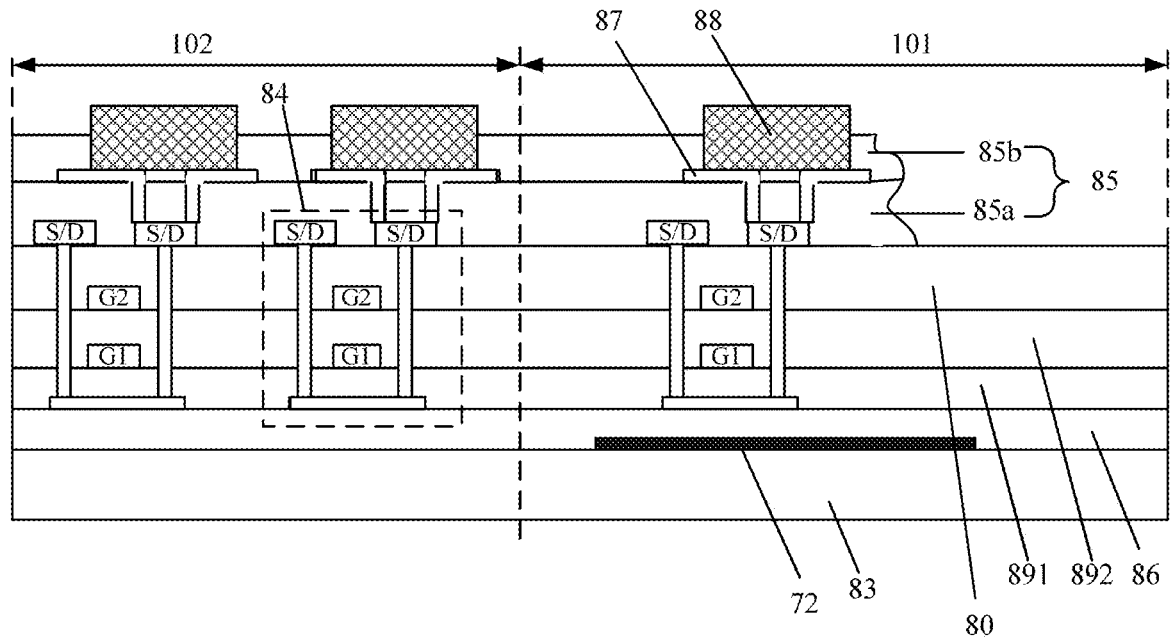
FIG. 12A to FIG. 12C schematically illustrates cross-sectional views of several display panels in one or more embodiments of the present disclosure.

FIG. 12A schematically illustrates a partial cross-sectional view of a display panel in one or more embodiments of the present disclosure. As shown in FIG. 12A, similar to the embodiments shown in FIGS. 10, 11, and 16, the display panel has a first area 101 and a second area 102, and the light transmittance of the first area 101 is greater than the light transmittance of the second area 102. In this embodiment, the light-shielding portion 72 may be provided at least in the first area 101.

The display panel may further include a first substrate 83 and a thin film transistor (TFT) 84 on the first substrate 83. The light-shielding portion 72 is located on the first substrate 83 in the first area 101 and between the thin film transistor 84 and the first substrate 83. In this configuration, the light-shielding portion 72 may also reduce the adverse effect on the imaging quality of the imaging element due to the reflection or diffraction of the ambient light by the thin film transistor 84.

As a non-limiting example, the first substrate 83 may be a transparent substrate, which may be made of a light-transmitting and non-metal material having rigidity such as glass, quartz, or transparent resin. Alternatively, the first substrate 83 may be a flexible substrate made of polyimide (PI).

The display panel may further include an additional layer 85 located in the second area 102 and extending to the first area 101. In this embodiment, the orthographic projection of an edge of the additional layer 85 close to the first area 101 on the display substrate of the display panel is within the orthographic projection of the light-shielding portion 72 on the display substrate. With this arrangement, it is possible to further reduce the incidence of light into the imaging element on the back of the display panel due to the edge diffraction of the additional layer 85, thereby improving the imaging quality of the imaging element. In an exemplary embodiment, the additional layer 85 may include at least one of a planarization layer 85a and a pixel defining layer 85b.

As further shown in FIG. 12A, the display panel may further include a buffer layer 86, an electrode layer 87, and a light emitting material layer 88. The buffer layer 87 is located on the light-shielding portion 72. The planarization layer 85a is located on the thin film transistor 84. The electrode layer 87 is located on the planarization layer 85a. The pixel defining layer 85b has an open area and is located on the electrode layer 87. The luminescent material layer 88 is located in the open area of the pixel defining layer 85b. In an example embodiment, the electrode layer 87 is electrically connected to the source/drain electrode of the thin film transistor through a through hole penetrating the planarization layer 85a.

In the example embodiment shown in FIG. 12A, the thin film transistor 84 is shown as a double-gate type. In this case, the display panel may further include a first gate insulation layer 891 between an active layer of the thin film transistor 84 and the first gate G1, a second gate insulation layer 892 between the first gate insulation layer 891 and the second gate G2 of the thin film transistor, and an interlayer dielectric layer 80 between the second gate G2 of the thin film transistor and the planarization layer 85a. It can be understood that, in the embodiments of the present disclosure, other types of thin film transistors may also be used, such as single-gate thin film transistors.

In the exemplary embodiment shown in FIG. 12A, the first substrate 83, the buffer layer 86, the first gate insulation layer 891, the second gate insulation layer 892, and the interlayer dielectric layer 80 are located in the light-transmitting area 301 of the first area 101.

In one or more embodiments of the present disclosure, some or all of the first substrate 83, the buffer layer 86, the first gate insulation layer 891, the second gate insulation layer 892, the interlayer dielectric layer 80 are provided with openings in areas corresponding to the light-transmitting areas 301, in order to improve the light transmittance of the light-transmitting area 301.

Figure 12B:
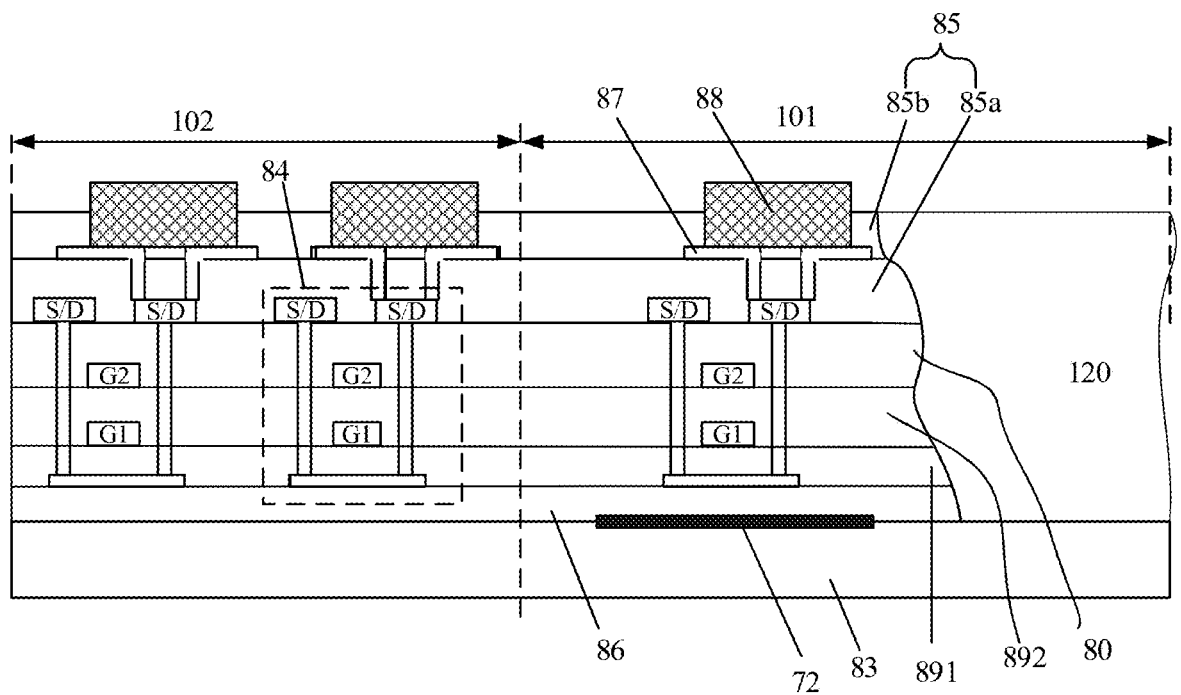

FIG. 12B schematically illustrates a partial cross-sectional view of another display panel in one or more embodiments of the present disclosure. In the embodiment shown in FIG. 12B, in addition to the first substrate 83, other layers of the display panel, including the buffer layer 86, the first gate insulation layer 891, the second gate insulation layer 892, the interlayer dielectric layer 80, and the planarization layer 85a and the pixel defining layer 85b are provided with the openings 120 in the areas corresponding to the light-transmitting areas 301. The first substrate 83 may be provided as a transparent substrate. In this way, the light transmittance of the light-transmitting area 301 may be improved.

Unlike the embodiment shown in FIG. 12A, in the embodiment shown in FIG. 12B, the orthographic projections of the edges of the openings of the buffer layer 86, the first gate insulation layer 891, the second gate insulation layer 892, the interlayer dielectric layer 80, the planarization layer 85a, and the pixel defining layer 85b in the light-transmitting area 301 on the first substrate 83 does not overlap with the orthographic projection of the light-shielding portion 72 on the first substrate 83. Additionally, in order to reduce the diffraction of light at edges of these layers, these edges may also be provided with a curved profile.

Figure 12C:
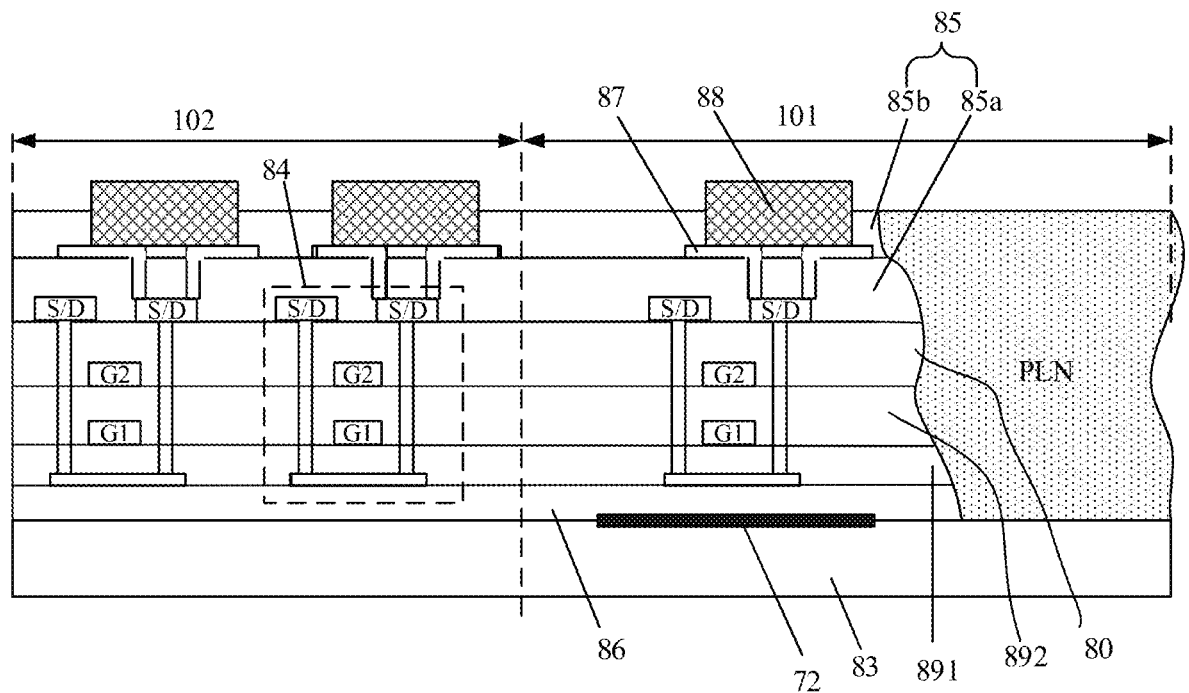

FIG. 12C schematically illustrates a partial cross-sectional view of still another display panel in one or more embodiments of the present disclosure. Unlike the embodiment shown in FIG. 12B, in the embodiment shown in FIG. 12C, at least partially transparent organic materials are filled in the openings of the buffer layer 86, the first gate insulation layer 891, and the second gate insulation layer 892, the interlayer dielectric layer 80, the planarization layer 85a and the pixel defining layer 85b, in order to improve the mechanical strength of the display panel in the light-transmitting area 301.

Figure 13:
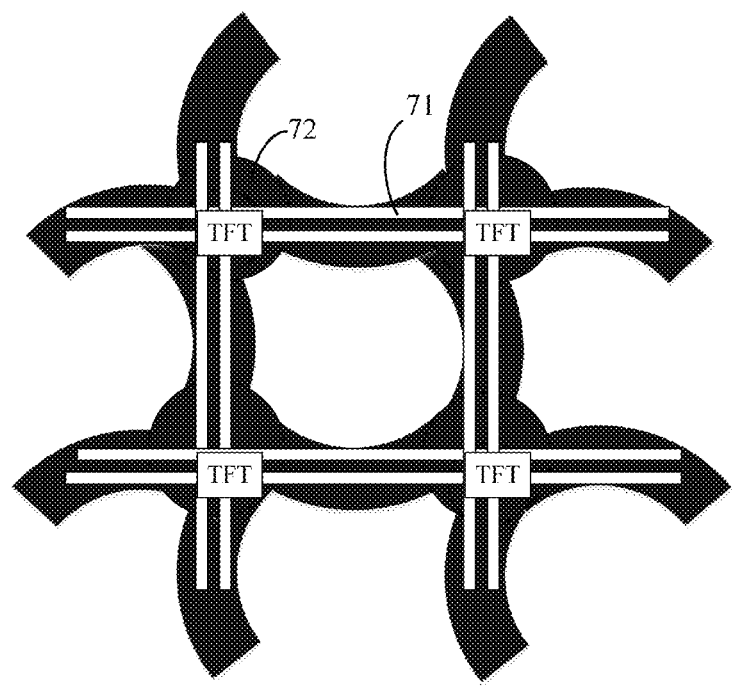
FIG. 13 schematically illustrates a partial structural view of still another display panel in one or more embodiments of the present disclosure.

FIG. 13 schematically illustrates a partial structural view of still another display panel in one or more embodiments of the present disclosure. In the embodiment shown in FIG. 13, the curved profile of the light-shielding portion 72 may also be a profile defined by a plurality of arcs arranged in sequence along the extending direction of the light-shielding portion 72. In the one or more embodiments, adjacent arcs of the plurality of arcs have opposite bending directions.

Figure 14:
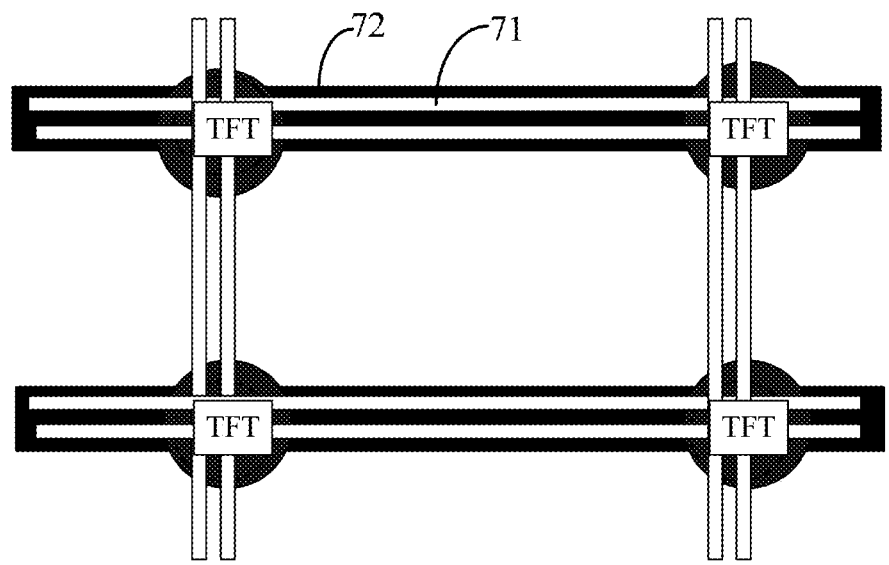
FIG. 14 schematically illustrates a partial structural view of still another display panel in one or more embodiments of the present disclosure.

FIG. 14 schematically illustrates a partial structure view of still another display panel in one or more embodiments of the present disclosure. As shown in FIG. 14, the curved profile of the light-shielding portion 72 may be located at the position where a pixel driving circuit (including a driving transistor) of each pixel is located, and an orthographic projection of the pixel driving circuit on the display substrate is located within the orthographic projection of the light-shielding portion on the display substrate. By way of example, the curved profile of the light-shielding portion 72 may have a circular or oval shape.

Figure 17:
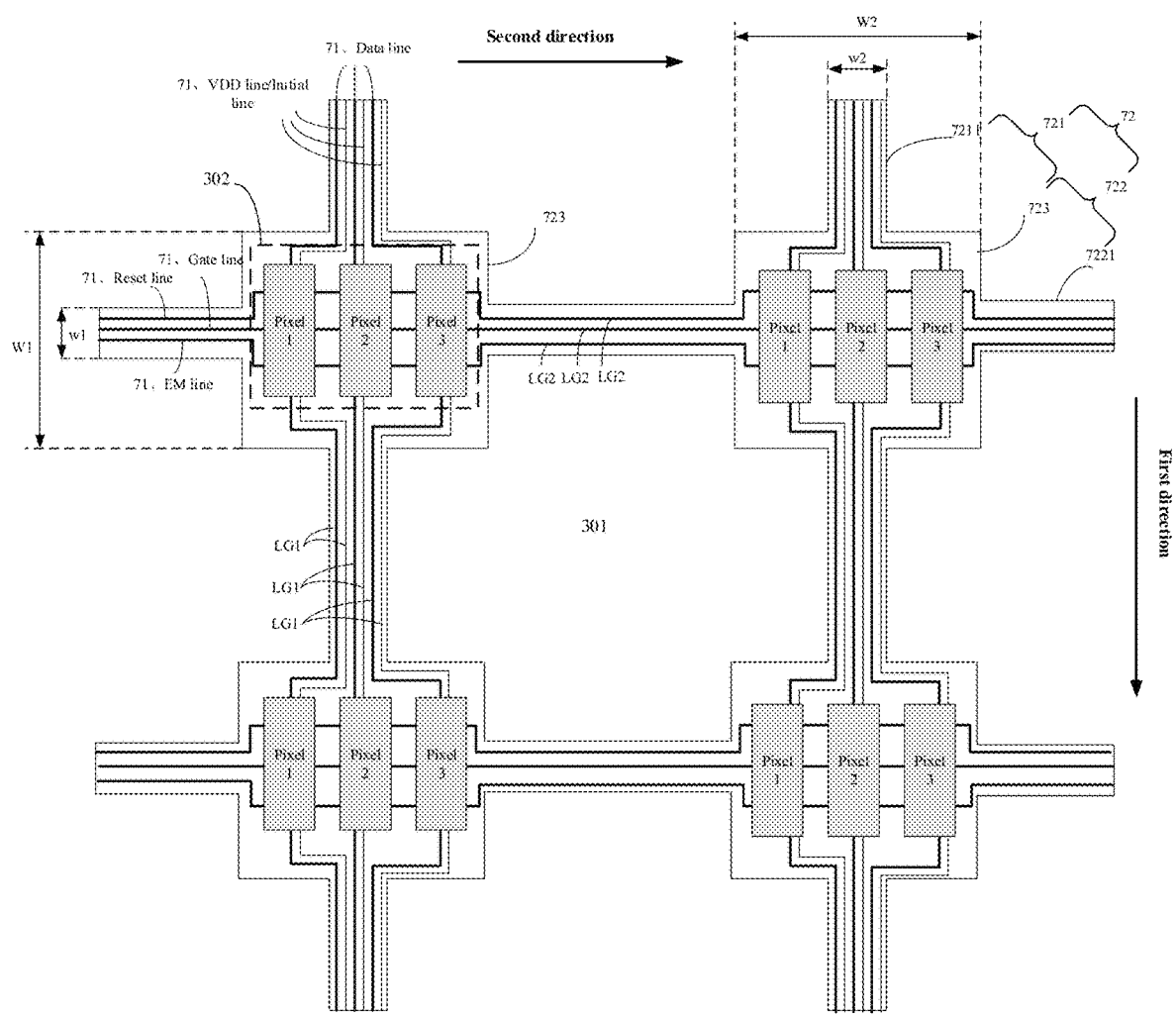
FIG. 17 schematically illustrates a partial plan view of a first area of a display panel in one or more embodiments of the present disclosure.

FIG. 17 schematically illustrates a partial plan view of a first area of a display panel in one or more embodiments of the present disclosure. As shown in FIG. 17, the first light-shielding portions 721 extending in the first direction and the second light-shielding portions 722 extending in the second direction intersect with each other, thereby forming intersection portions 723 at intersection positions. In other words, the first light-shielding portions 721 may include a plurality of intersection portions 723 at the intersection positions of the first light-shielding portions 721 and the second light-shielding portions 722 and a plurality of first extending portions 7211 extending in the first direction, and the second light-shielding portions 722 may include the plurality of intersection portions 723 and a plurality of second extending portions 7221 extending in the second direction.

In some embodiments of the present disclosure, as shown in FIG. 17, a maximum width W1, in the first direction, of each intersection portion 723 is greater than a maximum width w1, in the first direction, of the second extension portion 7221 of the second light-shielding portion 722 corresponding to the intersection portion; and a maximum width W2, in the second direction, of each intersection portion 723 is greater than a maximum width w2, in the second direction, of the first extending portion 7211 of the first light-shielding portion 721 corresponding to the intersection.

Continuing to refer to FIG. 17, the display panel may further include a plurality of light-transmitting areas 301 and a plurality of pixel islands 302 located in the first area. As described above with reference to FIGS. 10, 11, and 16, the plurality of light-transmitting areas 301 may be opening areas defined by the light-shielding portion 72, i.e., defined by the first light-shielding portions 721 and the second light-shielding portions 722 crossing each other Therefore, the light-shielding portion 72 and the light-transmitting areas 301 do not overlap in the thickness direction of the display panel. The plurality of pixel islands 302 overlap with the plurality of intersection portions 723 of the light-shielding portion 72 in the thickness direction of the display panel, respectively. In other words, orthographic projections of the plurality of pixel islands 302 on the substrate are within orthographic projections of the plurality of intersections on the substrate respectively. Each pixel island 302 may include a plurality of pixels, for example, Pixel 1, Pixel 2, and Pixel 3. Pixel 1, Pixel 2, and Pixel 3 may be a red pixel, a green pixel, and a blue pixel, respectively. By arranging the pixel islands 302 including a plurality of pixels to overlap the intersection portions 723 of the light-shielding portion 72 in the thickness direction, the light-shielding portion 72 may block light (for example, ambient light) diffracted by the pixels or wirings connected to the pixels from entering the imaging element on the back side of the display panel to disadvantageously affects the imaging effect of the imaging element.

In some embodiments of the present disclosure, as described above and shown in FIG. 17, the wirings of the plurality of wirings 71 extending in the first direction may include one or more of a data line, an initial line/power supply line (VDD line) and a combination thereof lines; and wirings of the plurality of wirings 71 extending in the second direction may include one or more of a gate line, a reset line, a light emission control lines (EM line) and a combination thereof.

Figure 18:
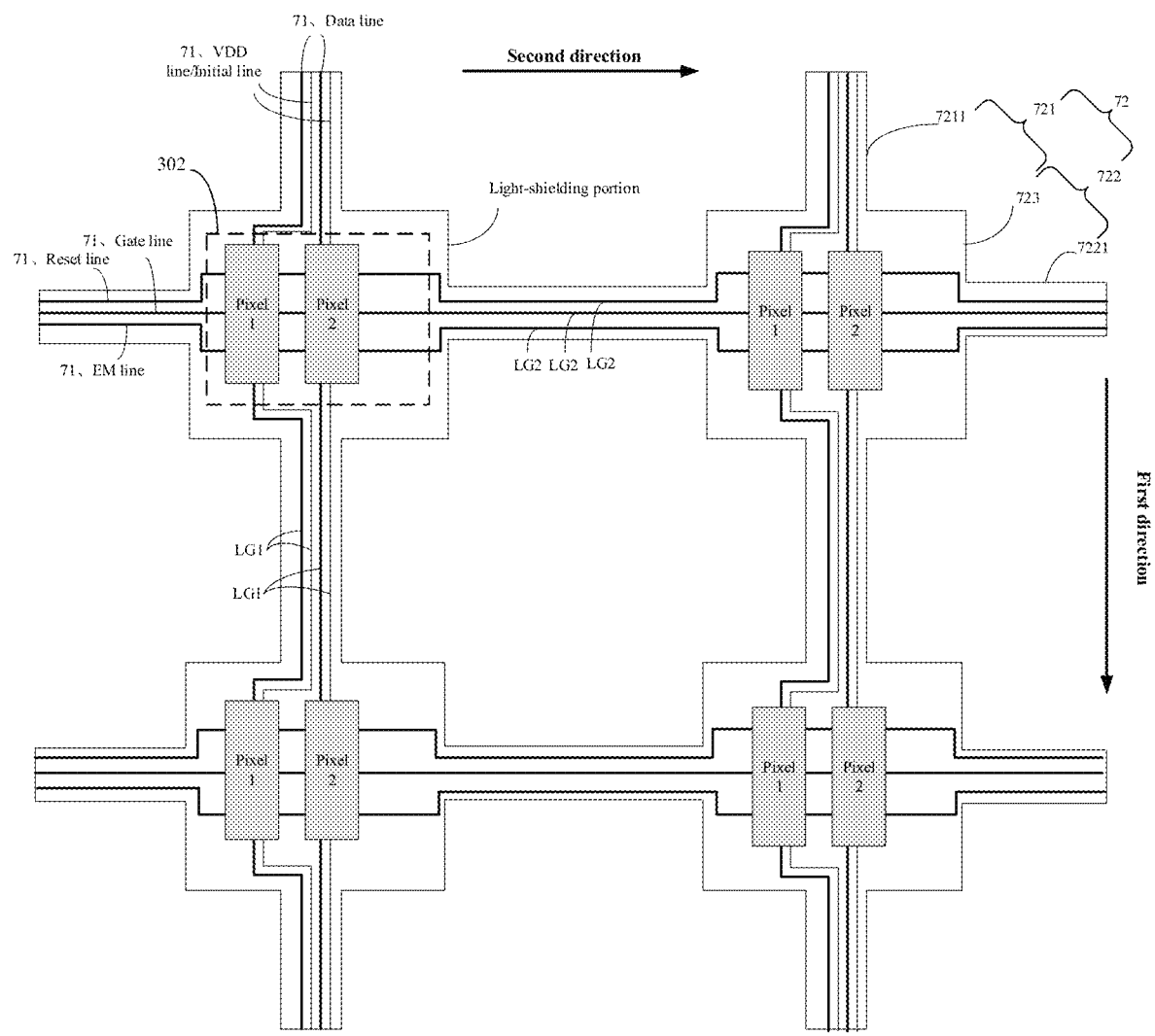
FIG. 18 schematically illustrates a partial plan view of a first area of another display panel in one or more embodiments of the present disclosure.

In some embodiments of the present disclosure, each first light-shielding portions 721 may correspond to more than two wirings extending in the first direction, and each second light-shielding portions 722 may correspond to more than two wirings extending in the second direction, as shown in FIGS. 17 and 18.

In the exemplary embodiment shown in FIG. 17, the wirings corresponding to (overlapping in the thickness direction with) each first light-shielding portion 721 may include three wiring groups LG1s. For example, each of the three wiring groups LG1s includes at least two wirings, one of which is a data line and the other one of which is an initial line/power supply line (VDD line). A minimum distance between portions of adjacent wiring groups LG1s of the three wiring groups, overlapping in the thickness direction of the display panel with the intersection 723 of the first light-shielding portion 721 is greater than a minimum distance between portions of adjacent wiring groups LG1s overlapping in the thickness direction of the display panel with the first extension portion 7211 of the first light-shielding portion 721. As an example, the portions of two wiring groups LG1s at two sides of the three wiring groups, corresponding to (overlapping with) the first extension portion 7211 of the first light-shielding portion 721, are brought to be more adjacent to the wiring group LG1 in the middle of the three wiring groups.

In the exemplary embodiment shown in FIG. 17, the wirings corresponding to (overlapping in the thickness direction with) each second light-shielding portion 722 include three wiring groups LG2s, each of which includes at least one wiring. As an example, the three wiring groups LG2s include a gate line, a reset line, and a light emission control lines (EM line), respectively. A minimum distance between portions of adjacent wirings of the three wirings overlapping in the thickness direction of the display panel with the intersection portion 723 of the second light-shielding portion 722 is greater than a minimum distance between portions of the adjacent wirings overlapping in the thickness direction of the display panel with the second extending portion 7221 of the second light-shielding portion 722. As an example, the portions of the two wirings (e.g., the reset line and the EM line) at two sides of the three wirings, corresponding to (overlapping with) the second extension 7221 of the second light-shielding portion 722, are brought to be more adjacent to the wiring (e.g., the gate line) in the middle of the three wirings.

The area of the light-transmitting areas 301 in the first area 101 may be increased by bringing the wirings more adjacent to each other, thereby increasing the light transmittance of the first area 101.

Continuing to refer to FIG. 17, different wiring groups LG1s of the wiring groups LG1s extending in the first direction supply signals to different pixels in a pixel island 302, and different wiring groups LG2s of the wiring groups LG2s extending in the second direction supply signals to a same pixel in pixel island 302.

FIG. 18 schematically illustrates a partial plan view of the first area of another display panel in one or more embodiments of the present disclosure. As shown in FIG. 18, the wirings corresponding to (overlapping in the thickness direction with) each first light-shielding portion 721 include two wiring groups LG1s. For example, each of the two wiring groups LG1s includes at least two wirings, one of which is a data line and the other one of which is an initial line/power supply line (VDD line). A minimum distance between portions of the two wiring groups LG1 overlapping in the thickness direction of the display panel with the intersection portion 723 of the first light-shielding portion 721 is greater than a minimum distance between portions of the two wiring groups LG1s overlapping in the thickness direction of the display panel with the first extension portion 7211 of the first light-shielding portion 721. As an example, a portion of one of the two wiring groups LG1s, corresponding to (overlapping with) the first extension portion 7211 of the first light-shielding portion 721, is brought to be more adjacent to the other one of the two wiring group LG1s.

Continuing to refer to FIG. 18, similar to the embodiment shown in FIG. 17, the wirings corresponding to (overlapping in the thickness direction with) each second light-shielding portion 722 include three wiring groups LG2s, each of which includes at least one wiring, and different wiring groups LG2s includes different types of wirings. As an example, the three wiring groups LG2s include a gate line, a reset line, and a light emission control lines (EM lines), respectively. A minimum distance between portions of adjacent wirings of the three wirings overlapping in the thickness direction of the display panel with the intersection portion 723 of the second light-shielding portion 722 is greater than a minimum distance between portions of the adjacent wirings overlapping in the thickness direction of the display panel with the second extending portion 7221 of the second light-shielding portion 722. As an example, portions of the two wirings (e.g., the reset line and the EM line) at two sides of the three wirings, corresponding to (overlapping with) the second extension 7221 of the second light-shielding portion 722, are brought to be more adjacent to the wiring (e.g., the gate line) in the middle of the three wirings.

The area of the light-transmitting areas 301 in the first area 101 may be increased by bring the wirings more adjacent to each other, thereby increasing the light transmittance of the first region 101.

In the embodiment shown in FIG. 18, each pixel island 302 includes two pixels. Different ones of the wiring groups extending in the first direction supply signals to different pixels in the pixel island 302, while different ones of the wiring groups extending in the second direction supply signals to a same pixel in the pixel island 302.

Figure 19:
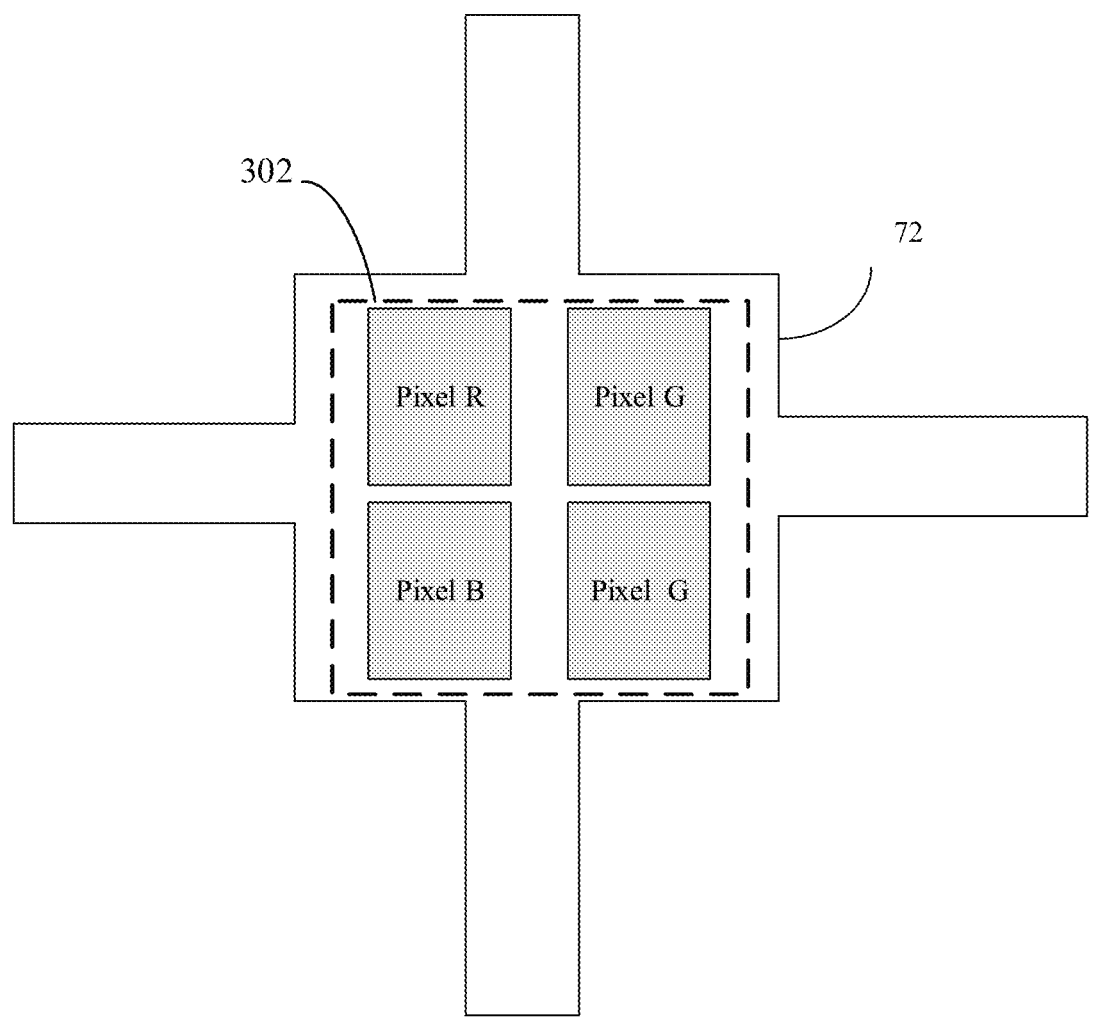
FIG. 19 schematically illustrates an arrangement of pixels in a pixel island of a display panel in one or more embodiments of the present disclosure.

FIG. 19 illustrates an arrangement of pixels in a pixel island of a display panel in one or more embodiments of the present disclosure. As shown in FIG. 19, each pixel island 302 includes four pixels arranged in a 2×2 array. As an example, the four pixels include a red pixel (R) at the upper left of the array, a blue pixel (B) at the lower left of the array, and two green pixels (G) at the upper right and lower right of the array.

Figure 20:
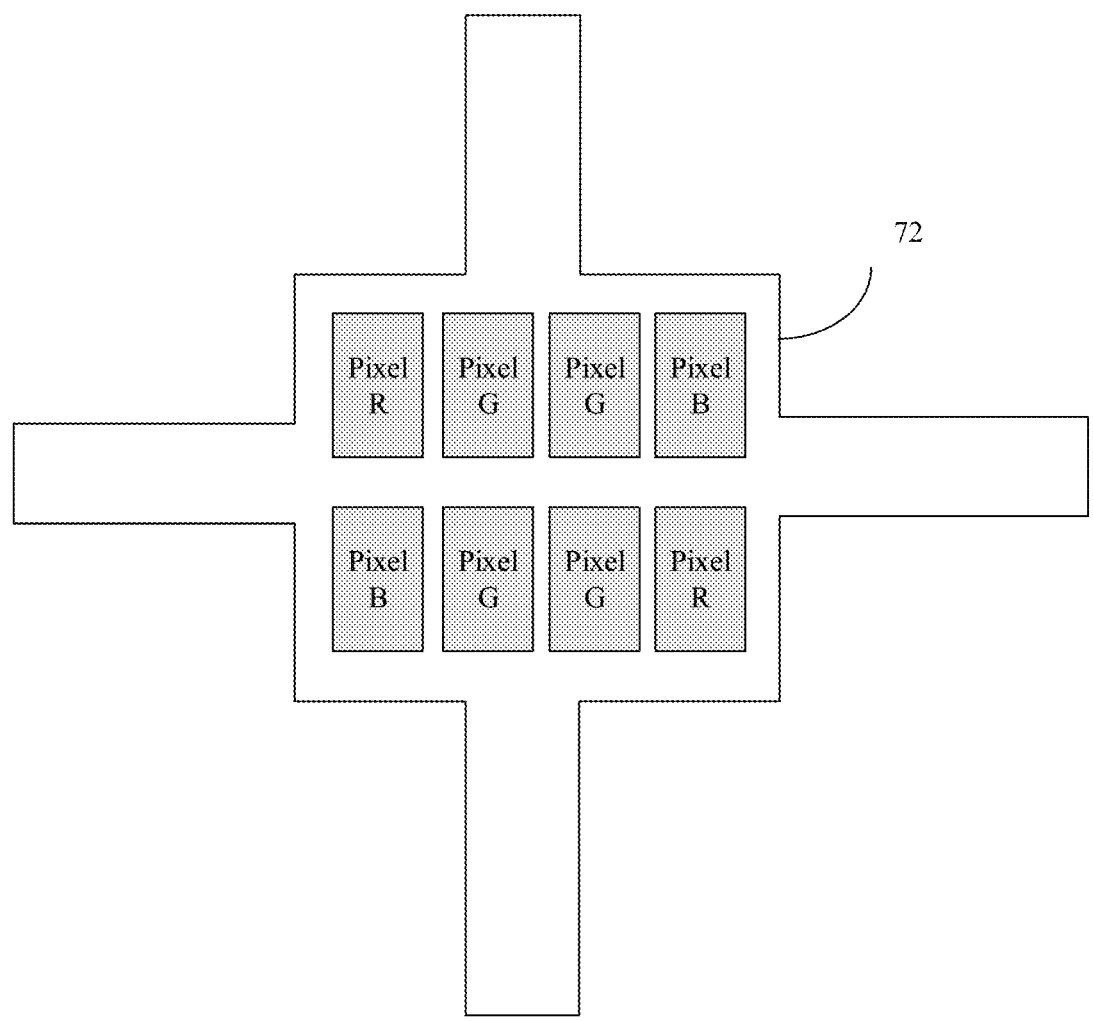
FIG. 20 schematically illustrates another arrangement of pixels in a pixel island of a display panel in one or more embodiments of the present disclosure.

FIG. 20 illustrates another arrangement of pixels in a pixel island of a display panel in one or more embodiments of the present disclosure. As shown in FIG. 20, each pixel island 302 includes 8 pixels arranged in a 2×4 array. As an example, the 8 pixels include a red pixel (R) at the upper left of the array, a blue pixel (B) at the lower left of the array, a blue pixel (B) at the upper right of the array, a red pixel (R) at the lower right of the array, and four green pixels (G) in the center of the array.

It should be noted that, in the embodiments shown in FIGS. 17 to 20, the edges of the light-shielding portion 72, including the edges of the intersection portions 723, the edges of the first extension portions 7211 and the second extension portions 7221, and the edges of the resulting light-transmitting areas 301 are all illustrated as flat (i.e., straight). However, in some embodiments of the present disclosure, the edges of the intersection portions 723, the first portion 7211 and second extension portion 7221 may have curved profiles, i.e., nonlinear (e.g., concave-convex) edges. In an exemplary embodiment, the edge profiles of the first extension portions 7211 or the second extension portions 7221 of the light-shielding portion 72 (hereinafter collectively referred to as the extension portions 7211 and 7221) may be one or more of a wave shape, a sawtooth shape, a sharp pulse shape, a shape formed by continuously arranged circle arcs, and a combination thereof.

Figure 21A:
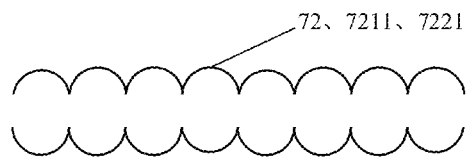
FIG. 21A to FIG. 21J schematically illustrate several profile shapes of the edges of a first extension portion or a second extension portion of the light-shielding portion in one or more embodiments of the present disclosure.

FIGS. 21A-21J schematically illustrate several profile shapes of the edges of the first extension portion 7211 or the second extension portion 7221 of the light-shielding portion 72 (hereinafter collectively referred to as extension portions 7211 and 7221 for convenience). As shown in FIGS. 21A-

21J, the two opposing edges of the extension portions 7211 and 7221 may have one or more of the following shapes:

(A) including a plurality of circular arc-shaped protrusions arranged continuously and regularly and a plurality of depressions formed between the circular arc-shaped protrusions (FIG. 21A).

Figure 21B:
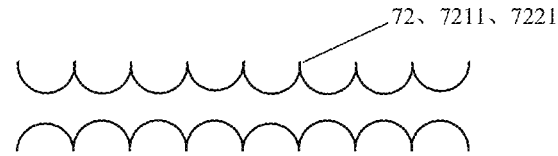

(B) including a plurality of circular arc-shaped depressions arranged continuously and regularly and a plurality of sharp protrusions formed between the circular arc-shaped depressions (FIG. 21B).

Figure 21C:
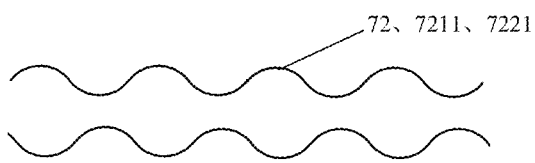
Figure 21D:
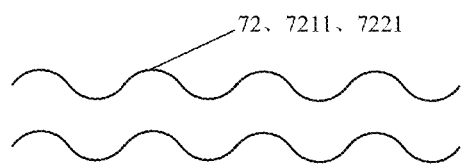

(C) including a sine or cosine wave-like profile formed by a plurality of depressions and a plurality of protrusions (FIGS. 21C and 21D). As an example shown in FIG. 21C, the wave shapes of the two opposite edges of the extension portion have a phase difference of $\pi$, and as another example shown in FIG. 21D, the wave shapes of the two opposite edges of the extension portion have no phase difference.

Figure 21E:
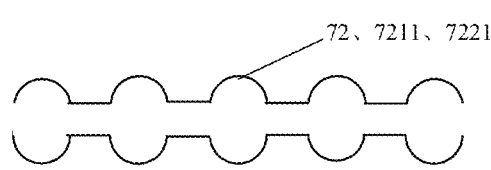
Figure 21F:
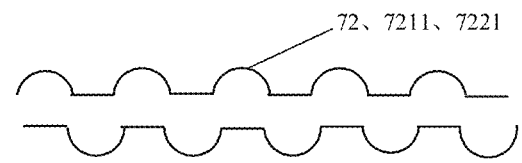
Figure 21G:
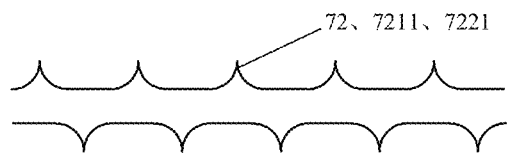

(D) including a profile formed by alternately arranging a plurality of protrusions and a plurality of flats (FIGS. 21E and 21F). As an example shown in FIG. 21E, the protrusions of one edge of an extension portion are aligned with the protrusions of the other one edge, and the flats of the one edge are aligned with the flats of the other edge; and as another example shown in FIG. 21F, the protrusions of one edge of the extension portion are aligned with the flats of the other edge.

Figure 21H:
Figure 21I:
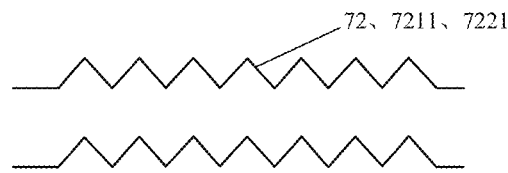

(E) including a sharp pulse profile formed by alternately arranging a plurality of sharp protrusions and a plurality of flats (FIG. 21G); or (F) including a sawtooth wave profile formed by alternately arranging a plurality of sharp protrusions and a plurality of sharp depressions (FIGS. 21H and 21O. As an example shown in FIG. 21H, the sharp protrusions of one edge of an extension portion are aligned with the sharp protrusions of the other one edge, and the sharp depressions of the one edge are aligned with the sharp depressions of the other one edge. As another example shown in FIG. 21H, the sharp protrusions of one edge of an extension portion are aligned with the sharp depressions of the other one edge.

In one or more embodiments of the present disclosure, the profiles of the two opposing edges of the extension portions 7211, 7221 may be symmetrical each other about an axis parallel to an extension direction of the extension portions (for example, FIG. 21A, FIG. 21B, FIG. 21C, FIG. 21E, FIG. 21H), and may also be asymmetric each other (for example, FIG. 21D, FIG. 21F, FIG. 21G, FIG. 21I, FIG. 21J).

Figure 21J:

In alternative embodiments of the present disclosure, the two opposing edges of the extension portions 7211, 7221 may have a combination of any of the edges shown in FIGS. 21A to 21I and other edges not shown in the figures. As an example, the upper edge of the extension portion 7221 may include a plurality of circular arc-shaped protrusions that are continuously and regularly arranged, and the lower edge of the extension part 7221 may include a plurality of circular arc-shaped depressions that are continuously and regularly arranged (FIG. 21J). As another example, the upper edge of the extension portion 7221 may include a sharp pulse profile, while the lower edge of the extension portion 7221 may include a sine or cosine wave profile.

Figure 22A:
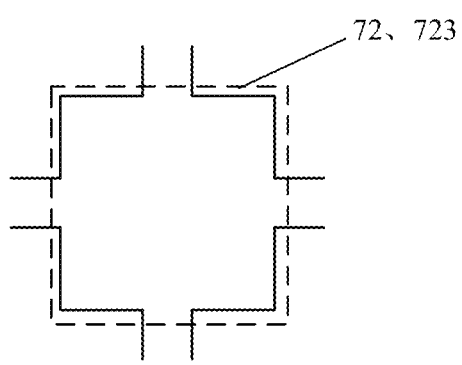
FIG. 22A to FIG. 22C schematically illustrate several profile shapes of edges of an intersection portion of the light-shielding portion in one or more embodiments of the present disclosure.
Figure 22B:
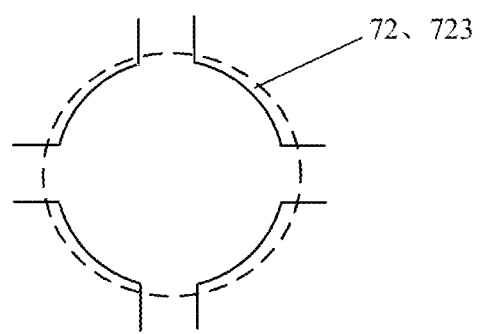
Figure 22C:
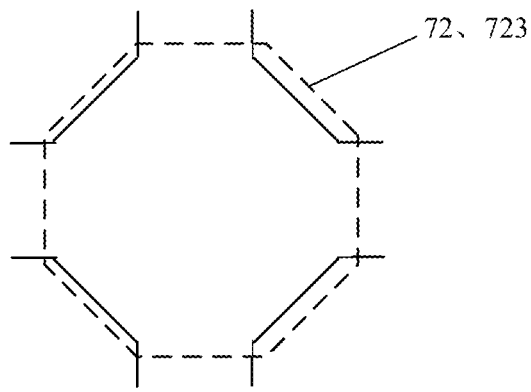

FIGS. 22A to 22C schematically illustrate several profile shapes of edges of intersection portions 723 of the light-shielding portion 72 in one or more embodiments of the present disclosure. As shown in FIGS. 22A to 22C, the edge of the intersection portion 723 of the light-shielding portion 72 may include a rectangular profile (FIG. 22A), a circular or elliptical profile (FIG. 22B), or an octagonal profile (FIG. 22C). In alternative embodiments, the edges of the intersection portion 723 of the light-shielding portion may include an uneven (concave-convex) substantially rectangular profile, an uneven (concave-convex) substantially circular profile, and an uneven (concave-convex) substantially octagonal profile. The uneven edge of the intersection portion 723 may have any suitable shape. For example, the uneven edge of intersection portion 723 may include any of the uneven edges shown in FIGS. 21A-21J, or a combination of the uneven edges shown in FIGS. 21A-21J.

It can be understood that, the edge profiles of the light-transmitting areas 301 may be defined by the edges of the light-shielding portion 72 (including the edges of the extension portions 7211, 7221 and the edges of the intersection portion 723), since the light-transmitting areas 301 corresponds to the opening areas of the light-shielding portion 72. In other words, the edge profiles of the light-transmitting regions 301 may be complementary to those of the light-shielding portion 72 (including the extension portions 7211, 7221 and the intersection portions 723). Specifically, at a convex position of an edge of the light-shielding portion 72, an edge of a light-transmitting area 301 is concave toward a convex direction of a light-shielding portion 72; and at a concave position of the edge of the light-shielding portion 72, the edge of the light-transmitting area 301 is convex toward a concave direction of the light-shielding portion 72.

Figure 23:
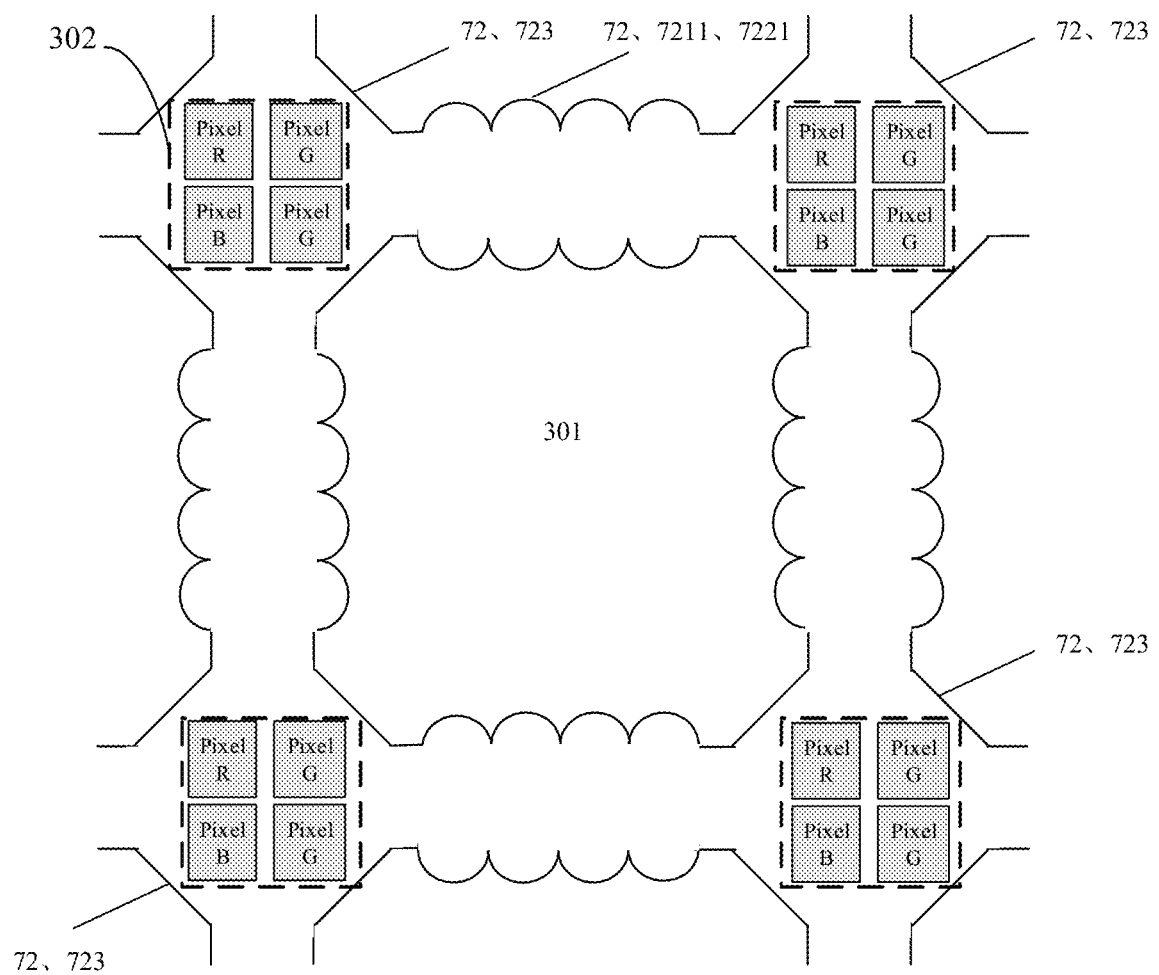
FIG. 23 is a plan view illustrating an edge profile of a light-transmitting area of a display panel defined by a light-shielding portion in one or more embodiments of the present disclosure.

FIG. 23 is a plan view illustrating an edge profile of a light-transmitting area of a display panel defined by a light-shielding portion in one or more embodiments of the present disclosure. As shown in FIG. 23, the edge profile of the light-transmitting area 301 is defined by the edge profile of the light-shielding portion. As an example, in the case that the edges of the extension portions 7211, 7221 of the light-shielding portion 72 are formed by continuously arranged arc-shaped protrusions, the profiles of the four sides of a light-transmitting region 301 are formed by continuously arranged arc-shaped depressions, and in the case that the edges of the intersection portions 723 of the light-shielding portion 72 are formed by straight sides, portions of the light-transmitting region 301 corresponding to the edges of the intersection portions are also straight sides.

Figure 24:
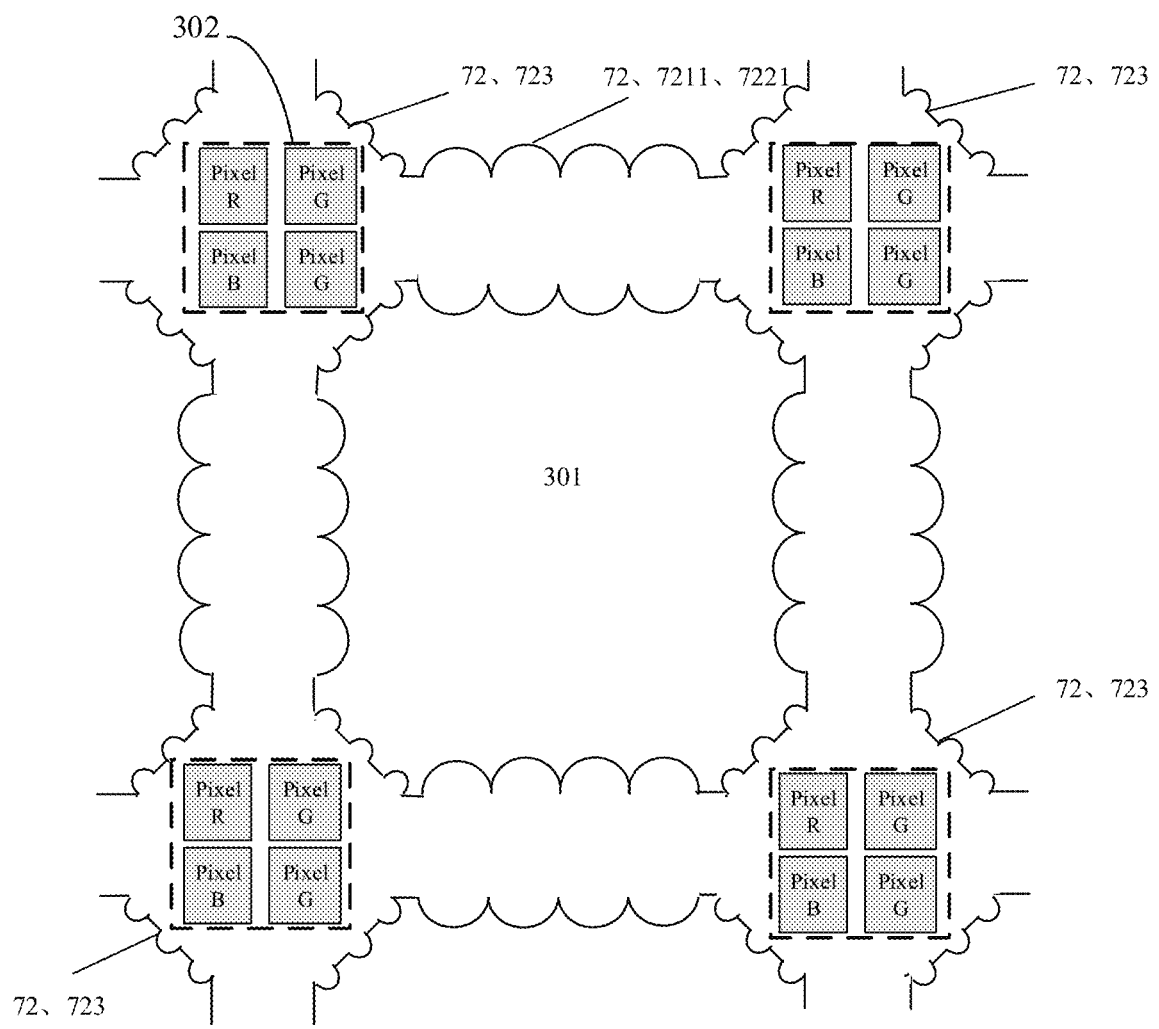
FIG. 24 is a plan view illustrating another edge profile of a light-transmitting area of a display panel defined by a light-shielding portion in one or more embodiments of the present disclosure.

FIG. 24 is a plan view illustrating another edge profile of a light-transmitting area of a display panel defined by a light-shielding portion in one or more embodiments of the present disclosure. The embodiment shown in FIG. 24 is different from the embodiment shown in FIG. 23 in the shape of the edge of the intersection portion 723 of the light-shielding portion 72. Specifically, as shown in FIG. 24, the edge of the intersection portion of the light-shielding portion 72 may include four sides each formed by alternately arranging a plurality of protrusions and a plurality of flats. Accordingly, portions of the light-transmitting region 301 corresponding to the edges of the intersection portion are a profile formed by alternately arranging a plurality of depressions and a plurality of flats.

In the embodiments shown in FIGS. 23 and 24, a pixel island 302 including a plurality of pixels, such as a pixel island 302 having a pixel arrangement in the embodiment shown in FIG. 19, is provided at the position of the intersection portion 723 of the light-shielding portion 72. Alternatively, the pixel islands disposed at the positions of the intersection portions 723 of the light-shielding portion 72 may also have other arrangements, such as the pixel arrangement of the pixel islands in the embodiment shown in FIG. 20.

It should be noted that, in order to demonstrate particular effects, advantages and feasibility of the present disclosure, the profile shape of the light-shielding portion 72 is, in general, employed herein as an exemplary shape of the curved profile, however, not intended to limit the scope of the present disclosure to this specific profile shape. By virtue of these examples, the skilled person may rather easily recognize how to adapt the related parameters and conditions when employing a different shape of the curved profile.

It should further be noted that, in some embodiments of the present disclosure, for the convenience of explanation, the first light-shielding portions 721, the second light-shielding portions 722, the intersection portions 723, the first extension portions 7211 and the second extension portions 7221 are described in a separate manner. However, in practice, the light-shielding portion 72 including the first light-shielding portions 721, the second light-shielding portions 722, the intersection portions 723, the first extension portions 7211 and the second extension portions 7221 may also be formed as an integrated structure.

In another aspect of the disclosure, a display device is disclosed. The display device may include a display panel according to the present disclosure, such as the display panel according to one or more embodiments disclosed in detail above. Therefore, for an alternative embodiment of the display device, reference may be made to the embodiments of the display panel.

Figure 15:
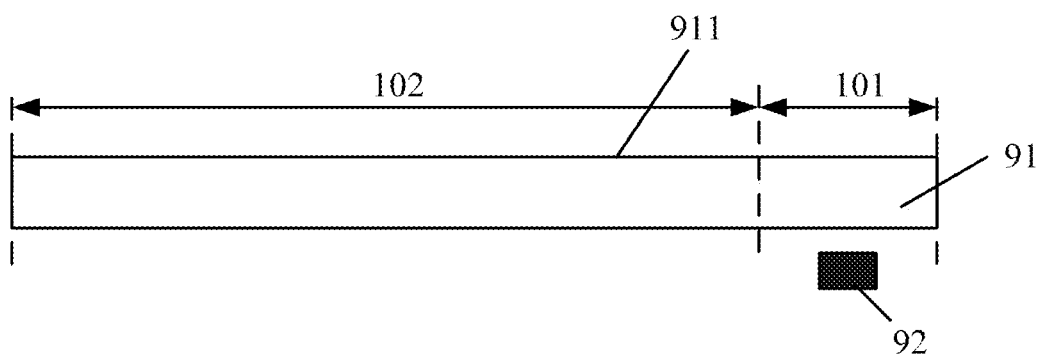
FIG. 15 schematically illustrates a display device in one or more embodiments of the present disclosure.

FIG. 15 schematically illustrates a display device in one or more embodiments of the present disclosure. As shown in FIG. 15, the display device includes a display panel 91 and an imaging element 92. In some embodiments, the display panel may be a display panel in any one of the embodiments shown in FIGS. 7 and 10-20. The display panel 91 may have a first area 101 and a second area 102. The light transmittance of the first area 101 is greater than the light transmittance of the second area 102. The imaging element 92 is located on a side of the display panel 91 away from the display substrate 911.

According to the display device provided by the embodiments of the present disclosure, each light-shielding portion 72 may shield at least two wirings 71, so that ambient light may be prevented from being diffracted at a gap between the at least two wirings 71. Therefore, the adverse effect on the imaging quality of the imaging element due to the diffraction of light may be reduced.

As used herein, the term "on" does not refer to a specific geometric orientation of the final stack of the display panel or display device relative to a direction of a gravitational force, but rather indicates a way of manufacturing the stack, which, after manufacturing, could, in general, be placed in any geometric orientation, also such as turned upside down.

Furthermore, when an element or layer is referred to as being "on" another element or layer, it may be directly on the other element or layer, or intervening elements or layers may be present. Likewise, when the element or layer is referred to as "under" another element or layer, it may be directly under the other element or layer, or there may be at least one intervening element or layer. When the element or layer is referred to as "between two elements or layers", it may be the only element or layer between the two elements or layers, or there may be more than one intermediate element or layer.

As used herein, the expressions "have", "comprise" and "contain" as well as grammatical variations thereof are used in a non-exclusive way. Thus, the expression "A has B" as well as the expression "A comprises B" or "A contains B" may both refer to the fact that, besides B, A contains one or more further components and/or constituents, and to the case in which, besides B, no other components, constituents or elements are present in A.

Furthermore, when introducing elements and embodiments of the present disclosure, the articles "a," "an," "the," and "said" are intended to mean that there are one or more of the elements. Unless otherwise stated, "multiple" means two or more. The terms "first", "second", "third", etc. are used for descriptive purposes only, and cannot be understood to indicate or imply relative importance and order of formation.

The foregoing description of the embodiment has been provided for purpose of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are included within the scope of the disclosure.

What is claimed is:

1. The display panel comprising:
   a first area and a second area located at least on a side of the first area, wherein a light transmittance of the first area is greater than a light transmittance of the second area;
   a substrate at least located in the first area and the second area;
   a plurality of wirings located on a side of the substrate and at least in the first area; and
   a light-shielding portion located on the side of the substrate and comprising at least one first light-shielding portion located in the first area and extending in a first direction,
   wherein, orthographic projections, on the substrate, of at least portions of at least two of the plurality of wirings extending in the first direction are within an orthographic projection of a same first light-shielding portion on the substrate, and the orthographic projection of at least a portion of the at least one first light-shielding portion on the substrate has a curved profile,
   wherein the light-shielding portion further comprises at least one second light-shielding portion located in the first area and extending in a second direction, and
   wherein orthographic projections of portions, extending in the second direction, of at least two of the plurality of wirings on the substrate are within an orthographic projection of the at least one second light-shielding portion on the substrate, and the orthographic projection of at least a portion of the at least one second light-shielding portion on the substrate has a curved profile.

2. The display panel according to claim 1, wherein the at least one first light-shielding portion comprises at least one intersection portion at an intersection position of the at least one first light-shielding portion and the at least one second light-shielding portion, and at least one first extension portion extending in the first direction; and
   the at least one second light-shielding portion comprises the at least one intersection portion and at least one second extension portion extending in the second direction, a size of each of the at least one intersection portion is selected to satisfy at least one of:
a maximum width, in the first direction, of each of the at least one intersection portion is greater than a maximum width, in the first direction, of the second extension portion of the at least one second light-shielding portion, and
a maximum width, in the second direction, of each of the at least one intersection portion is greater than a maximum width, in the second direction, of the first extension portion of the at least one first light-shielding portion.

3. The display panel according to claim 2, further comprising a plurality of light-transmitting areas located in the first area, wherein orthographic projections of the plurality of light-transmitting areas on the substrate do not overlap with the orthographic projection of the light-shielding portion on the substrate.

4. The display panel according to claim 2, further comprising at least one pixel island located in the first area, each pixel island comprising at least one pixel, wherein an orthographic projection of the at least one pixel island on the substrate is within an orthographic projection of the at least one intersection portion on the substrate.

5. The display panel according to claim 4, wherein the at least two wirings at least comprise adjacent first wiring group and second wiring group extending in the first direction, the first wiring group and the second wiring group each comprising at least one wiring,
and wherein a minimum distance between portions of the first wiring group and of the second wiring group overlapping with the intersection portion is greater than a minimum distance between portions of the first wiring group and of the second wiring group overlapping with the first extension portion; or
wherein the at least two wirings at least comprise adjacent third wiring group and fourth wiring group extending in the second direction, the third wiring group and fourth wiring group each comprising at least one wiring,
and wherein a minimum distance between portions of the third wiring group and of the fourth wiring group overlapping with the intersection portion is greater than a minimum distance between portions of the third wiring group and of the fourth wiring group overlapping with the second intersection portion.

6. The display panel according to claim 5, wherein the plurality of wirings are arranged such that they satisfy at least one of:
the first wiring group and the second wiring group supply signals to different pixels in a same pixel island; and
the third wiring group and the fourth wiring group supply signals to same pixels in the same pixel island.

7. The display panel according to claim 4, wherein
the at least one pixel comprises a thin film transistor, and wherein the light-shielding portion is located between the thin film transistor and the substrate, and an orthographic projection of the thin film transistor on the substrate is within an orthographic projection of the light-shielding portion on the substrate.

8. The display panel according to claim 2, wherein the at least a portion of the at least one first light-shielding portion comprises at least a portion of an edge of the first extension portion or an edge of the intersection portion, and the at least a portion of the at least one second light-shielding portion comprises at least a portion of an edge of the second extension portion or an edge of the intersection portion.

9. The display panel according to claim 8, wherein the curved profile is at least one of a wave shape, a sawtooth shape, a sharp pulse shape, and a shape formed by continuously arranged circular arcs, and wherein the wave shape comprises a plurality of wave units.

10. The display panel according to claim 9, wherein a curvature radius of at least one of the plurality of wave units at a peak is 5-10 µm.

11. The display panel according to claim 9, wherein the light-shielding portion is designed such that it satisfies at least one of:
the first light-shielding portion comprises two wave-shaped edges opposite each other in a direction perpendicular to an extending direction of the first light-shielding portion, and peaks of the wave units of one of the two wave-shaped edges of the first light-shielding portion are aligned with peaks or troughs of the wave units of the other one of the two wave-shaped edges of the first light-shielding portion; and
the second light-shielding portion comprises two wave-shaped edges opposite each other in a direction perpendicular to an extending direction of the second light-shielding portion, and peaks of the wave units of one of the two wave-shaped edges of the second light-shielding portion are aligned with peaks or troughs the wave units of the other one of the two wave-shaped edges of the second light-shielding portion.

12. The display panel according to claim 9, wherein the light-shielding portion is designed such that it satisfies at least one of:
the at least one first light-shielding portion includes a plurality of first light-shielding portions, and peaks of the wave units of one of two adjacent first light-shielding portions are aligned in the second direction with peaks or troughs of the wave units of the other one of the two adjacent first light-shielding portions; and
the at least one second light-shielding portion includes a plurality of second light-shielding portions, and peaks of the wave units of one of two adjacent second light-shielding portions are aligned in the first direction with peaks or troughs of the wave units of the other one of the two adjacent second light-shielding portions.

13. The display panel according to claim 12, wherein the light-shielding portion is designed such that it satisfies at least one of:
a minimum distance between the two adjacent first light-shielding portions is greater than 80 µm; and
a minimum distance between the two adjacent second light-shielding portions is greater than 80 µm.

14. The display panel according to claim 12, wherein the light-shielding portion is designed such that it satisfies at least one of:
a minimum distance between the two adjacent first light-shielding portions is greater than 120 µm; and
a minimum distance between the two adjacent second light-shielding portions is greater than 120 µm.

15. The display panel according to claim 1, wherein wirings of the plurality of wirings extending in the first direction comprise one or more of a data line, an initial signal line, a power supply line and a combination thereof; and wirings of the plurality of wirings extending in the second direction comprise one or more of a gate line, a reset line, a light emission control line and a combination thereof.

16. The display panel according to claim 1, wherein the light-shielding portion is designed such that it satisfies at least one of:

the at least one first light-shielding portion has a symmetrical shape with respect to an axis parallel to the first direction; and the at least one second light-shielding portion has a symmetrical shape with respect to an axis parallel to the second direction.

17. The display panel according to claim 1, wherein both the first area and the second area comprise a plurality of pixels, and a density of pixels in the first area is less than or equal to a density of pixels in the second area.

18. The display panel according to claim 1, further comprising an additional film layer located in the second area and extending to the first area, wherein an orthographic projection of the light-shielding portion on the substrate is within an orthographic projection of the additional layer on the substrate.

19. A display device comprising:

the display panel according to claim 1; and an imaging element located on a side of the display panel away from the display surface, wherein an orthographic projection of the imaging element on the display panel is at least partially located within the first area.

\* \* \* \* \*